United States Patent
Hu et al.

(10) Patent No.: US 10,147,732 B1
(45) Date of Patent: Dec. 4, 2018

(54) SOURCE STRUCTURE OF THREE-DIMENSIONAL MEMORY DEVICE AND METHOD FOR FORMING THE SAME

(71) Applicant: Yangtze Memory Technologies Co., Ltd., Wuhan, Hubei (CN)

(72) Inventors: Yushi Hu, Hubei (CN); Zhenyu Lu, Hubei (CN); Qian Tao, Hubei (CN); Jun Chen, Hubei (CN); Simon Shi-Ning Yang, Hubei (CN); Steve Weiyi Yang, Hubei (CN)

(73) Assignee: Yangtze Memory Technologies Co., Ltd., Wuhan, Hubei (CN)

( * ) Notice: Subject to any disclaimer, the term of this patent is extended or adjusted under 35 U.S.C. 154(b) by 0 days.

(21) Appl. No.: 15/934,738

(22) Filed: Mar. 23, 2018

Related U.S. Application Data

(63) Continuation of application No. PCT/CN2018/077767, filed on Mar. 1, 2018.

(30) Foreign Application Priority Data

Nov. 30, 2017 (CN) .......................... 2017 1 1236924

(51) Int. Cl.
| | |
|---|---|
| *H01L 27/11* | (2006.01) |
| *H01L 27/11524* | (2017.01) |
| *G11C 16/04* | (2006.01) |
| *H01L 27/1157* | (2017.01) |

(52) U.S. Cl.
CPC ........ *H01L 27/11524* (2013.01); *G11C 16/04* (2013.01); *H01L 27/1157* (2013.01)

(58) Field of Classification Search
CPC ....................... H01L 27/11524; H01L 27/1157
See application file for complete search history.

(56) References Cited

U.S. PATENT DOCUMENTS

| | | | | |
|---|---|---|---|---|
| 2016/0141419 A1* | 5/2016 | Baenninger | ....... | H01L 27/11524 257/314 |
| 2016/0372481 A1* | 12/2016 | Izumida | ............ | H01L 27/11582 |
| 2017/0179154 A1* | 6/2017 | Furihata | ............ | H01L 27/11524 |

\* cited by examiner

*Primary Examiner* — Mark Tornow
(74) *Attorney, Agent, or Firm* — Sterne, Kessler, Goldstein & Fox P.L.L.C.

(57) ABSTRACT

Embodiments of source structure of a three-dimensional (3D) memory device and method for forming the source structure of the 3D memory device are disclosed. In an example, a NAND memory device includes a substrate, an alternating conductor/dielectric stack, a NAND string, a source conductor layer, and a source contact. The alternating conductor/dielectric stack includes a plurality of conductor/dielectric pairs above the substrate. The NAND string extends vertically through the alternating conductor/dielectric stack. The source conductor layer is above the alternating conductor/dielectric stack and is in contact with an end of the NAND string. The source contact includes an end in contact with the source conductor layer. The NAND string is electrically connected to the source contact by the source conductor layer. In some embodiments, the source conductor layer includes one or more conduction regions each including one or more of a metal, a metal alloy, and a metal silicide.

21 Claims, 17 Drawing Sheets

US 10,147,732 B1

SOURCE STRUCTURE OF THREE-DIMENSIONAL MEMORY DEVICE AND METHOD FOR FORMING THE SAME

CROSS-REFERENCE TO RELATED APPLICATIONS

This application claims priority to Chinese Patent Application No. 201711236924.1 filed on Nov. 30, 2017 and PCT Patent Application No. PCT/CN2018/077767 filed on Mar. 1, 2018, which are incorporated herein by reference in their entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

BRIEF SUMMARY

Embodiments of 3D memory architectures and fabrication methods thereof are disclosed herein.

According to some embodiments of the present disclosure, a NAND memory device includes a substrate, an alternating conductor/dielectric stack, a NAND string, a source conductor layer, and a source contact. The alternating conductor/dielectric stack includes a plurality of conductor/dielectric pairs above the substrate. The NAND string extends vertically through the alternating conductor/dielectric stack. The source conductor layer is above the alternating conductor/dielectric stack and is in contact with a first end of the NAND string. The source contact includes a first end in contact with the source conductor layer. The NAND string is electrically connected to the source contact by the source conductor layer.

In some embodiments, the source conductor layer includes one or more conduction regions each including a metal, a metal alloy, and/or a metal silicide. The metal can include copper, cobalt, nickel, titanium, and/or tungsten. The metal alloy can include an alloy of at least two of copper, cobalt, nickel, titanium, and tungsten. The metal silicide can include copper silicide, cobalt silicide, nickel silicide, titanium silicide, and/or tungsten silicide.

In some embodiments, the NAND memory device includes an epitaxial silicon layer between the NAND string and the source conductor layer. The NAND string can be electrically connected to the source conductor layer by the epitaxial silicon layer. The source conductor layer can include a plurality of conduction regions and one or more isolation regions electrically isolating the plurality of conduction regions. The NAND string can be electrically connected to the source contact by a first conduction region of the plurality of conduction regions.

In some embodiments, the NAND memory device includes a through array contact (TAC) extending vertically through the alternating conductor/dielectric stack. The TAC can be in contact with a second conduction region of the plurality of conduction regions.

In some embodiments, the NAND memory device includes a first interconnect layer (e.g., a back-end-of-line (BEOL) interconnect layer). The first interconnect layer can include a first contact and a second contact. The NAND string can be electrically connected to the first contact by the first conduction region. The TAC can be electrically connected to the second contact by the second conduction region.

In some embodiments, the NAND memory device includes a peripheral device between the substrate and the NAND string. The NAND memory device can also include a second interconnect layer (e.g., a peripheral interconnect layer) above and in contact with the peripheral device. The second interconnect layer can include one or more conductor layers in one or more dielectric layers. The NAND memory device can further include a third interconnect layer (e.g., an array interconnect layer) in contact with a second end of the NAND string and a second end of the source contact. The third interconnect layer can include one or more conductor layers in one or more dielectric layers.

In some embodiments, the NAND memory device includes a bonding interface between the second interconnect layer and the third interconnect layer. The peripheral device can be electrically connected to the NAND string by the second interconnect layer and the third interconnect layer.

According to some embodiments of the present disclosure, a method for forming a NAND memory device is disclosed. An alternating conductor/dielectric stack is formed on a first substrate. A NAND string and a source contact both extending vertically through the alternating conductor/dielectric stack are formed. The first substrate is replaced with a source conductor layer, so that the source conductor layer is in contact with a first end of the NAND string and a first end of the source contact, and the NAND string is electrically connected to the source contact by the source conductor layer. In some embodiments, the source conductor layer includes one or more conduction regions each including a metal, a metal alloy, and/or a metal silicide.

In some embodiments, to replace the first substrate with the source conductor layer, the first substrate is removed, and the source conductor layer is formed at the original location of the first substrate. To remove the first substrate, the first substrate can be thinned, and the thinned first substrate can be removed.

In some embodiments, to replace the first substrate with the source conductor layer, a metal layer is formed on the first substrate, and a metal silicide layer is formed based on a reaction between silicon in the first substrate and a metal in the metal layer. To form the metal layer, the first substrate can be thinned, and the metal layer can be formed on the thinned first substrate. To form the metal layer, an isolation region can be formed at a first surface of the first substrate that is in contact with the alternating conductor/dielectric stack, and the first substrate can be thinned from a second surface of the first substrate to expose the isolation region. In some embodiments, one or more isolation regions are formed in the source conductor layer after the first substrate has been replaced with the source conductor layer.

In some embodiments, a peripheral device can be formed on a second substrate. The NAND string and the peripheral device can be joined, so that the NAND string is between the first substrate and the peripheral device. To join the NAND string and the peripheral device, a first interconnect layer in contact with a second end of the NAND string and a second end of the source contact can be formed, a second interconnect layer in contact with the peripheral device can be formed, and a bonding interface can be formed between the first interconnect layer and the second interconnect layer, so that the peripheral device can be electrically connected to the NAND string by the first interconnect layer and the second interconnect layer. The first interconnect layer can include one or more conductor layers in one or more dielectric layers. The second interconnect layer can include one or more conductor layers in one or more dielectric layers.

In some embodiments, to form the bonding interface between the first interconnect layer and the second interconnect layer, chemical bonds are formed between one of the dielectric layers in the first interconnect layer and one of the dielectric layers in the second interconnect layer, and/or physical inter-diffusion is caused between one of the conductor layers in the first interconnect layer and one of the conductor layers in the second interconnect layer.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
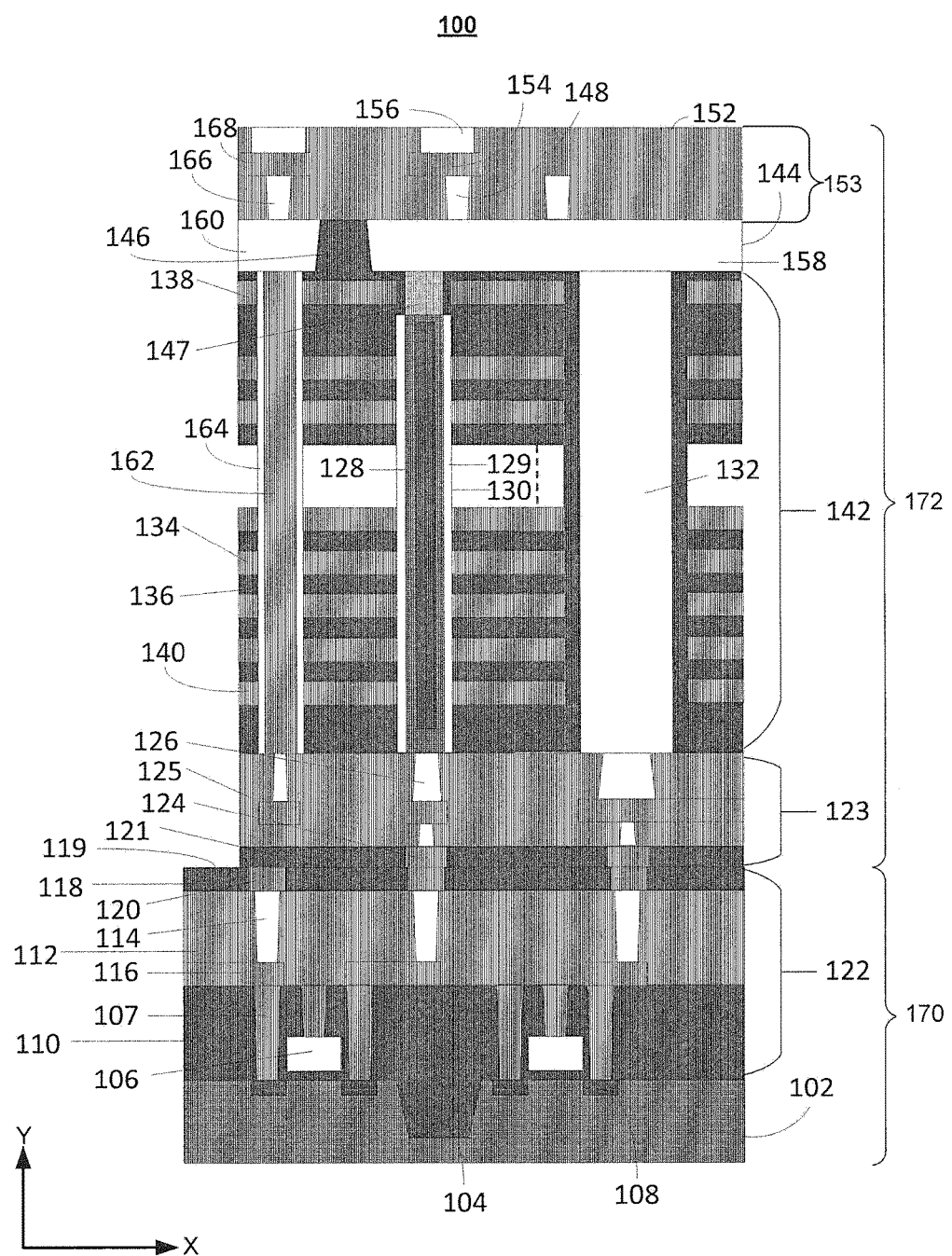
FIG. 1 illustrates a cross-section of a 3D memory device, according to some embodiments.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND strings) on a laterally-oriented substrate so that the memory strings extend in the vertical direction with respect to the substrate. As used herein, the term "vertical/vertically" means nominally perpendicular to the lateral surface of a substrate.

In some 3D memory devices, a source select gate controls the on/off state of a doped silicon channel formed in the substrate of the 3D memory device. The operation speed of the source select gate depends on the conductance of the silicon channel, which can be limited as silicon is a semiconductor material. Further, as the entire block of memory cells can share a single source select gate, the load to drive the array common source of the memory block can be challenging for the peripheral device.

Various embodiments in accordance with the present disclosure provide a 3D memory device with a source conductor layer in place of the silicon channel in the substrate used by other 3D memory devices. By replacing silicon with conductive materials (e.g., metal, metal alloy, and/or metal silicide) that form the source conductor layer disclosed herein, the resistance of the source side (e.g., between the common source contact and the NAND strings) of the 3D memory device can be reduced, thereby increasing the device operation speed. In some embodiments, the conduction mechanism for erase operation of the source select gate can become driven by gate-induced drain leakage (GIDL).

Moreover, compared with silicon substrate, the source conductor layer disclosed herein can be more easily patterned into any suitable layout (e.g., with different isolation regions) for driving a single memory block, multiple memory blocks, or a portion of a memory block as desired, which can enhance the driving capability of the peripheral device for the memory array. Due to its conductive nature, the source conductor layer disclosed herein can be patterned and used as an interconnect layer (e.g., part of the BEOL interconnect).

FIG. 1 illustrates a cross-section of an exemplary 3D memory device 100 according to some embodiments of the present disclosure. 3D memory device 100 can include a substrate 102, which can include silicon (e.g., single crystalline silicon), silicon germanium (SiGe), gallium arsenide (GaAs), germanium (Ge), silicon on insulator (SOI) or any other suitable materials.

3D memory device 100 can include a peripheral device on substrate 102. The peripheral device can be formed "on" substrate 102, in which the entirety or part of the peripheral device is formed in substrate 102 (e.g., below the top surface of substrate 102) and/or directly on substrate 102. The peripheral device can include a plurality of transistors 106 formed on substrate 102. An isolation region 104 and a doped region 108 (e.g., a source region or a drain region of transistor 106) can be formed in substrate 102 as well.

In some embodiments, the peripheral device can include any suitable digital, analog, and/or mixed-signal peripheral circuits used for facilitating the operation of 3D memory device 100. For example, the peripheral device can include one or more of a page buffer, a decoder (e.g., a row decoder and a column decoder), a sense amplifier, a driver, a charge pump, a current or voltage reference, or any active or passive components of the circuits (e.g., transistors, diodes, resistors, or capacitors). In some embodiments, the peripheral device is formed on substrate 102 using complementary metal-oxide-semiconductor (CMOS) technology (also known as a "CMOS chip").

3D memory device 100 can include a peripheral interconnect layer 122 above transistors 106 to transfer electrical signals to and from transistors 106. Peripheral interconnect layer 122 can include one or more contacts, such as a contact 107 and a contact 114, and one or more conductor layers, such as a conductor layer 116 and a conductor layer 120, each including one or more interconnect lines and/or vias. As used herein, the term "contact" can broadly include any suitable types of interconnects, such as middle-end-of-line (MEOL) interconnects and BEOL interconnects, including vertical interconnect accesses (e.g., vias) and lateral lines (e.g., interconnect lines). Peripheral interconnect layer 122 can further include one or more interlayer dielectric (ILD) layers, such as dielectric layers 110, 112, and 118. That is, peripheral interconnect layer 122 can include conductor layers 116 and 120 in dielectric layers 112 and 118. The contact and conductor layers in peripheral interconnect layer 122 can include conductor materials including, but not limited to, tungsten (W), cobalt (Co), copper (Cu), aluminum (Al), silicides, or any combination thereof. The dielectric layers in peripheral interconnect layer 122 can include dielectric materials including, but not limited to, silicon oxide, silicon nitride, silicon oxynitride, doped silicon oxide, or any combination thereof.

3D memory device 100 can include a memory array device above the peripheral device. It is noted that x and y axes are added in FIG. 1 to further illustrate the spatial relationship of the components in 3D memory device 100. Substrate 102 includes two lateral surfaces (e.g., a top surface and a bottom surface) extending laterally in the x-direction (the lateral direction or width direction). As used herein, whether one component (e.g., a layer or a device) is "on," "above," or "below" another component (e.g., a layer or a device) of a semiconductor device (e.g., 3D memory device 100) is determined relative to the substrate of the semiconductor device (e.g., substrate 102) in the y-direction (the vertical direction or thickness direction) when the substrate is positioned in the lowest plane of the semiconductor device in the y-direction. The same notion for describing spatial relationship is applied throughout the present disclosure.

In some embodiments, 3D memory device 100 is a NAND Flash memory device in which memory cells are provided in the form of an array of NAND strings 130 extending vertically above substrate 102. The array device can include a plurality of NAND strings 130 that extend through a plurality of conductor layer 134 and dielectric layer 136 pairs. The plurality of conductor/dielectric layer pairs are also referred to herein as an "alternating conductor/dielectric stack" 142. Conductor layers 134 and dielectric layers 136 in alternating conductor/dielectric stack 142 alternate in the vertical direction. In other words, except the ones at the top or bottom of alternating conductor/dielectric stack 142, each conductor layer 134 can be adjoined by two dielectric layers 136 on both sides, and each dielectric layer 136 can be adjoined by two conductor layers 134 on both sides. Conductor layers 134 can each have the same thickness or have different thicknesses. Similarly, dielectric layers 136 can each have the same thickness or have different thicknesses. For example, for a first plurality of conductor/dielectric pairs in alternating conductor/dielectric stack 142, the thickness of each conductor layer 134 and dielectric layer 136 can be between about 5 nm and about 40 nm (e.g., between 5 nm and 40 nm). For a second plurality of conductor/dielectric pairs in alternating conductor/dielectric stack 142, the thickness of each conductor layer 134 and dielectric layer 136 can be between about 10 nm and about 40 nm (e.g., between 10 nm and 40 nm). For a third plurality of conductor/dielectric pairs in alternating conductor/dielectric stack 142, the thickness of each conductor layer 134 can be between about 5 nm and about 40 nm (e.g., between 5 nm and 40 nm), and the thickness of each dielectric layer 136 can be between about 50 nm and about 200 nm (e.g., between 50 nm and 200 nm).

In some embodiments, alternating conductor/dielectric stack 142 includes more conductor layers or more dielectric layers with different materials and/or thicknesses than the conductor/dielectric layer pair. Conductor layers 134 can include conductor materials including, but not limited to, W, Co, Cu, Al, doped silicon, silicides, or any combination thereof. Dielectric layers 136 can include dielectric materials including, but not limited to, silicon oxide, silicon nitride, silicon oxynitride, or any combination thereof.

As shown in FIG. 1, each NAND string 130 can include a semiconductor channel 128 and a dielectric layer 129 (also known as "memory film"). In some embodiments, semiconductor channel 128 includes silicon, such as amorphous silicon, polysilicon, or single crystalline silicon. In some embodiments, dielectric layer 129 is a composite layer including a tunneling layer, a storage layer (also known as "charge trap/storage layer"), and a blocking layer. Each NAND string 130 can have a cylinder shape (e.g., a pillar shape). Semiconductor channel 128, the tunneling layer, the storage layer, and the blocking layer are arranged along a direction from the center toward the outer surface of the pillar in this order, according to some embodiments. The tunneling layer can include silicon oxide, silicon nitride, or any combination thereof. The thickness of the tunneling layer (e.g., in the radial direction of Each NAND string 130) can be between about 5 nm and about 15 nm (e.g., between 5 nm and 15 nm). The storage layer can include silicon nitride, silicon oxynitride, silicon, or any combination thereof. The thickness of the storage layer (e.g., in the radial direction of Each NAND string 130) can be between about 3 nm and about 15 nm (e.g., between 3 nm and 15 nm). The blocking layer can include silicon oxide, silicon nitride, high dielectric constant (high-k) dielectrics, or any combination thereof. In one example, the blocking layer can include a composite layer of silicon oxide/silicon nitride/silicon oxide (ONO) with a thickness between about 4 nm and about 15 nm (e.g., between 4 nm and 15 nm). In another example, the blocking layer can include a high-k dielectric layer, such as an aluminum oxide ($Al_2O_3$) layer with a thickness between about 1 nm and about 5 nm (e.g., between 1 nm and 5 nm).

In some embodiments, NAND strings 130 include a plurality of control gates (each being part of a word line) for NAND strings 130. Each conductor layer 134 in alternating conductor/dielectric stack 142 can act as a control gate for each memory cell of NAND string 130. As shown in FIG. 1, NAND string 130 can include a select gate 138 (e.g., a source select gate) at an upper end of NAND string 130. NAND string 130 can include another select gate 140 (e.g., a drain select gate) at a lower end of NAND string 130. As used herein, the "upper end" of a component (e.g., NAND string 130) is the end further away from substrate 102 in the y-direction, and the "lower end" of the component (e.g., NAND string 130) is the end closer to substrate 102 in the y-direction. As shown in FIG. 1, for each NAND string 130, source select gate 138 can be above drain select gate 140. In some embodiments, select gate 138 and select gate 140 include conductor materials including, but not limited to, W, Co, Cu, Al, doped silicon, silicides, or any combination thereof.

In some embodiments, 3D memory device 100 includes a source conductor layer 144 above alternating conductor/dielectric stack 142. The bottom surface of source conductor layer 144 can contact an upper end of NAND string 130. Source conductor layer 144 can include one or more conduction regions (e.g., conduction regions 158 and 160) and one or more isolation regions (e.g., isolation region 146) that electrically isolate the conduction regions. Different from a semiconductor layer (e.g., a doped silicon channel), the conductance of conduction regions 158 and 160 is independent from source select gate 138 because conduction regions 158 and 160 include conductive materials. Source conductor layer 144 thus can provide an electrical connection between one or more NAND strings 130 and a source contact 132 (e.g., acting as the common source contact of all NAND strings 130 in a memory block of 3D memory device 100) with lower resistance compared with other 3D memory devices in which a semiconductor channel is used for electrically connecting the NAND strings and the common source contact.

Conduction regions 158 and 160 can include conductive materials that have a higher electrical conductivity than a semiconductor material, such as silicon (e.g., amorphous silicon, single crystalline silicon, or polysilicon-either doped or undoped). In some embodiments, conduction regions 158 and 160 each has an electrical conductivity of at least about $1 \times 10^4$ S/m at about 20° C., such as at least $1 \times 10^4$ S/m at 20° C. In some embodiments, conduction regions 158 and 160 each has an electrical conductivity of between about $1 \times 10^4$ S/m and about $1 \times 10^8$ S/m at about 20° C., such as between $1 \times 10^4$ S/m and $1 \times 10^8$ S/m at 20° C. (e.g., $1 \times 10^4$ S/m, $1 \times 10^5$ S/m, $5 \times 10^5$ S/m, $1 \times 10^6$ S/m, $2 \times 10^6$ S/m, $3 \times 10^6$ S/m, $4 \times 10^6$ S/m, $5 \times 10^6$ S/m, $6 \times 10^6$ S/m, $7 \times 10^6$ S/m, $8 \times 10^6$ S/m, $9 \times 10^6$ S/m, $1\times10^7$ S/m, $2\times10^7$ S/m, $3\times10^7$ S/m, $4\times10^7$ S/m, $5\times10^7$ S/m, $6\times10^7$ S/m, $7\times10^7$ S/m, $8\times10^7$ S/m, $9\times10^7$ S/m, $1\times10^8$ S/m, any range bounded on the lower end by any of these values, or in any range defined by any two of these values, at 20° C.). The conductive materials in conduction regions 158 and 160 can include, but are not limited to, metals, metal alloys, and metal silicides. In some embodiments, conduction regions 158 and 160 each includes one or more metals, such as copper (Cu), cobalt (Co), nickel (Ni), titanium (Ti), and tungsten (W). The metals can also include any other suitable metals, such as silver (Ag), aluminum (Al), gold (Au), platinum (Pt), etc. In some embodiments, conduction regions 158 and 160 each includes one or more metal alloys, each of which is an alloy of at least two of Cu, Co, Ni, Ti, and W (e.g., TiNi alloy or a combination of TiNi alloy and TiW alloy), or any other suitable metal alloys of, for example, Ag, Al, Au, Pt, iron (Fe), chromium (Cr), etc. In some embodiments, conduction regions 158 and 160 each includes one or more metal silicides, such as copper silicide, cobalt silicide, nickel silicide, titanium silicide, and tungsten silicide. The metal silicides can also include any other suitable metal silicides, such as silver silicide, aluminum silicide, gold silicide, platinum silicide, etc.

Source conductor layer 144 can be patterned to form any suitable layout with different numbers of conduction regions and isolation regions in different arrangements. The different layouts of conduction regions and isolation regions in source conductor layer 144 can be used to drive the memory array in various configurations, such as an array of NAND strings in a single memory block, in multiple memory blocks, or in a portion of a memory block (e.g., one or more memory fingers). To accommodate the various configurations of the memory array to be driven by source conductor layer 144, in some embodiments, source conductor layer 144 is in a trench shape or in a plate shape in a plan view, so that the conduction regions (e.g., conduction region 158) can contact an array of NAND strings 130. In some embodiments, at least one conduction region (e.g., conduction region 160) in source conductor layer 144 is not in contact with NAND string 130 (e.g., being electrically isolated from conduction region 158 by isolation region 146). Conduction region 160 can be in contact with any suitable contact in the array device to provide electrical connections between the array device and/or peripheral device to the upper level interconnects (e.g., BEOL interconnects). That is, source conductor layer 144 can be patterned to form any suitable layout to function as part of the BEOL interconnects.

In some embodiments, isolation region 146 extends across the entire thickness of source conductor layer 144 to electrically isolate conduction region 158 and conduction region 160. Isolation region 146 can include dielectric materials including, but not limited to, silicon oxide, silicon nitride, silicon oxynitride, doped silicon oxide, any other suitable dielectric materials, or any combination thereof. Patterning process (e.g., photolithography and dry/wet etch) can be used for patterning isolation region 146 in source conductor layer 144. Isolation region 146 then can be formed by thermal growth and/or thin film deposition of the dielectric materials in the patterned region. The layout of multiple conduction regions (e.g., conduction regions 158 and 160) can be defined by the formation of the isolation regions (e.g., isolation region 146) in source conductor layer 144.

In some embodiments, NAND string 130 further includes an epitaxial layer 147 on an upper end of semiconductor channel 128 of NAND string 130. Epitaxial layer 147 can include a semiconductor material, such as silicon. Epitaxial layer 147 can be epitaxially grown from a semiconductor layer (e.g., a silicon substrate). For example, epitaxial layer 147 can be a single crystalline silicon layer epitaxially grown from a silicon substrate (e.g., prior to be removed and replaced with source conductor layer 144 in 3D memory device 100). For each NAND string 130, epitaxial layer 147 is referred to herein as an "epitaxial plug." Epitaxial plug 147 at the upper end of NAND string 130 can contact both conduction region 158 of source conductor layer 144 and semiconductor channel 128 of NAND string 130, thereby providing electrical connections between NAND string 130 and source conductor layer 144. Epitaxial plug 147 can extend vertically through the partial or entire thickness of source select gate 138 and can function as the channel that can be controlled by source select gate 138 at the upper end of NAND string 130. Source select gate 138 can control the conductance of epitaxial plug 147. On the other hand, as conduction region 158 of source conductor layer 144 above source select gate 138 includes conductive materials, source select gate 138 cannot control the conductance of conduction region 158. Thus, the control of the source side of NAND string 130 can be performed solely on epitaxial layer 147. In some embodiments, the thickness of source select gate 138 and the thickness of epitaxial layer 147 can each be tuned. For example, the thickness of source select gate 138 can be between about 5 nm and about 100 nm (e.g., between 5 nm and 100 nm), and the thickness of epitaxial layer 147 can be between about 1 nm and about 100 nm (e.g., between 1 nm and 100 nm).

In some embodiments, the array device further includes a source contact 132 that extends vertically through alternating conductor/dielectric stack 142. As shown in FIG. 1, an upper end of source contact 132 can contact conduction region 158 of source conductor layer 144 and can electrically connect to NAND string 130 by conduction region 158 of source conductor layer 144. In some embodiments, multiple NAND strings (e.g., an array of NAND strings of a single memory block, multiple memory blocks, or a portion of a memory block) can be electrically connected to source contact 132 by source conductor layer 144. Source contact 132 can thus be referred to as a "common source contact" of the multiple NAND strings. Source contact 132 can include conductor materials including, but not limited to, W, Co, Cu, Al, silicides, or any combination thereof. To electrically insulate source contact 132 from surrounding conductor layers 134 in alternating conductor/dielectric stack 142, a dielectric layer with any suitable dielectric materials can be between source contact 132 and alternating conductor/dielectric stack 142.

In some embodiments, the array device further includes a through array contact (TAC) 162 that extends vertically through alternating conductor/dielectric stack 142. TAC 162 can extend through the entire thickness of alternating conductor/dielectric stack 142, (e.g., all the conductor/dielectric pairs in the vertical direction). An upper end of TAC 162 can contact conduction region 160 in source conductor layer 144. TAC 162 can carry electrical signals from the peripheral device to a BEOL contact layer 166, a BEOL conductor layer 168, and a pad layer 156 by conduction region 160. TAC 162 can include a vertical opening through alternating conductor/dielectric stack 142 (e.g., formed by dry/wet etch process) filled with conductor materials. In some embodiments, a dielectric layer 164 is between TAC 162 and alternating conductor/dielectric stack 142 for electrical insulation purposes. TAC 162 can include conductor materials including, but not limited to, W, Co, Cu, Al, doped silicon, silicides, or any combination thereof. The opening of TAC 162 can be filled with conductor materials by ALD, CVD, PVD, electroplating, any other suitable processes, or any combination thereof.

As shown in FIG. 1, 3D memory device 100 can include an array interconnect layer 123 above and in contact with peripheral interconnect layer 122. Array interconnect layer 123 can include bit line contacts 126, one or more conductor layers (e.g., a conductor layer 124), and one or more dielectric layers (e.g., dielectric layers 121 and 125). Each bit line contact 126 can contact the lower end of a corresponding NAND string 130 to individually address corresponding NAND string 130. The conductor layers can include conductor materials including, but not limited to, W, Co, Cu, Al, silicides, or any combination thereof. The dielectric layers can include dielectric materials including, but not limited to, silicon oxide, silicon nitride, low-k dielectrics, or any combination thereof.

A bonding interface 119 can be formed between dielectric layer 118 of peripheral interconnect layer 122 and dielectric layer 121 of array interconnect layer 123. Bonding interface 119 can also be formed between conductor layer 124 of array interconnect layer 123 and conductor layer 120 of peripheral interconnect layer 122. Each of dielectric layer 118 and dielectric layer 121 can include silicon nitride or silicon oxide.

In some embodiments, a first semiconductor structure 170 is bonded to a second semiconductor structure 172 at bonding interface 119. First semiconductor structure 170 can include substrate 102, one or more peripheral devices on substrate 102, and peripheral interconnect layer 122. Second semiconductor structure 172 can include source conductor layer 144, array interconnect layer 123, alternating conductor/dielectric stack 142 having a plurality of conductor/dielectric layer pairs, and NAND string 130. First semiconductor structure 170 can include the elements shown below bonding interface 119 in FIG. 1, while second semiconductor structure 172 can include the elements shown above bonding interface 119 in FIG. 1. Peripheral interconnect layer 122 can include conductor layer 120, which contacts conductor layer 124 of array interconnect layer 123 at bonding interface 119. Peripheral interconnect layer 122 can also include dielectric layer 118, which contacts dielectric layer 121 of array interconnect layer 123 at bonding interface 119.

As shown in FIG. 1, 3D memory device 100 can further include a BEOL interconnect layer 153 above source conductor layer 144. In some embodiments, BEOL interconnect layer 153 includes conductor layers 154 and 168, contact layers 148 and 166, one or more dielectric layers (e.g., a dielectric layer 152), and one or more pad layers (e.g., pad layer 156). BEOL interconnect layer 153 can transfer electrical signals between 3D memory device 100 and external circuits. The conductor layers, contact layers, and pad layers (e.g., including bonding pads) in BEOL interconnect layer 153 can include conductor materials including, but not limited to, W, Co, Cu, Al, silicides, or any combination thereof. The dielectric layers in BEOL interconnect layer 153 can include dielectric materials including, but not limited to, silicon oxide, silicon nitride, low-k dielectrics, or any combination thereof.

BEOL interconnect layer 153 can be electrically connected to the peripheral device. Specifically, contact layer 166 of BEOL interconnect layer 153 can contact conduction region 160 of source conductor layer 144 at the top surface of source conductor layer 144. The upper end of TAC 162 can contact conduction region 160 of source conductor layer 144 at the bottom surface of source conductor layer 144. The lower end of TAC 162 can contact a contact in array interconnect layer 123.

In some embodiments, BEOL interconnect layer 153 includes source conductor layer 144 as well. For example, conduction region 158 of source conductor layer 144, in conjunction with contact layer 148, can electrically connect the array device (e.g., NAND string 130 and source contact 132) with other circuits (e.g., BEOL conductor layer 154 and pad layer 156). Similarly, conduction region 160 of source conductor layer 144, in conjunction with contact layer 166, TAC 162, array interconnect layer 123 and peripheral interconnect layer 122, can electrically connect the peripheral device (e.g., transistors 106) with other circuits (e.g., BEOL conductor layer 168 and pad layer 156). In some embodiments, as part of BEOL interconnect layer 153, source conductor layer 144 can be patterned to form any suitable layout for the conduction regions based on the desired interconnect configuration of the array device and peripheral device.

Figure 8:
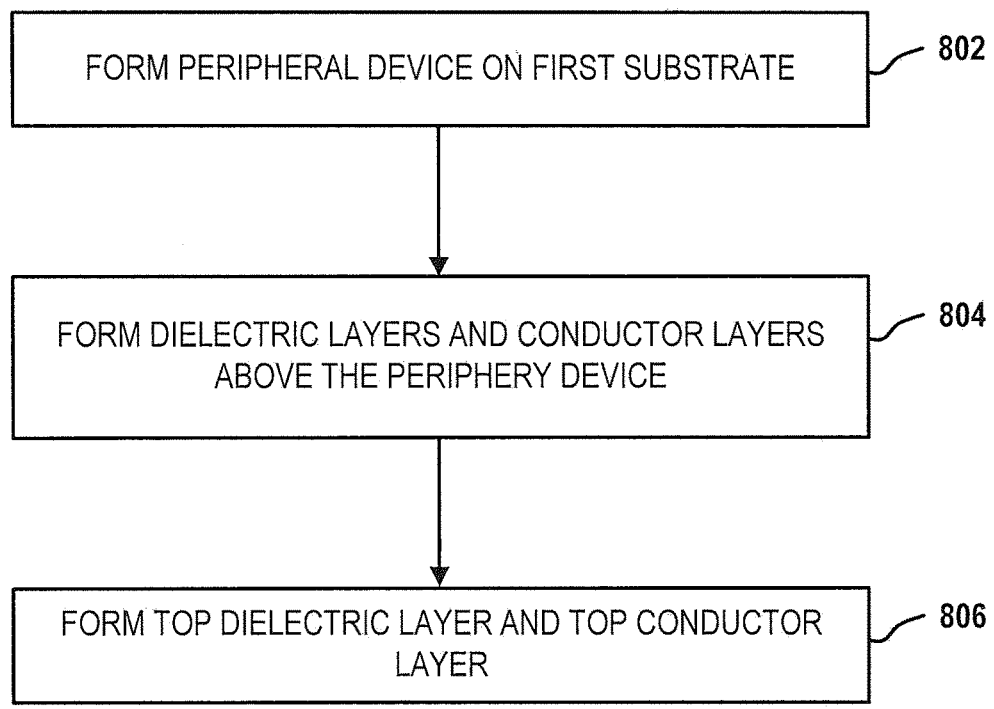
FIG. 8 is a flowchart of an exemplary method for forming a peripheral device and a peripheral interconnect layer, according to some embodiments.

FIGS. 2A-2D illustrate an exemplary fabrication process for forming a peripheral device and a peripheral interconnect layer. FIG. 8 is a flowchart of an exemplary method 800 for forming a peripheral device and a peripheral interconnect layer. An example of the peripheral device and peripheral interconnect layer depicted in FIGS. 2A-2D and FIG. 8 is the peripheral device (e.g., transistors 106) and peripheral interconnect layer 122 depicted in FIG. 1. It should be understood that the operations shown in method 800 are not exhaustive and that other operations can be performed as well before, after, or between any of the illustrated operations.

Figure 2A:
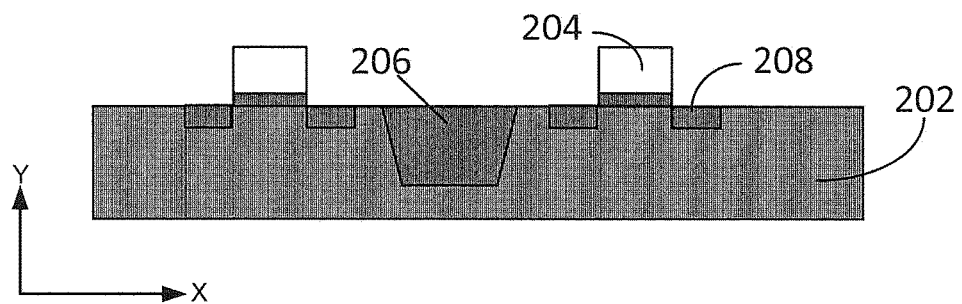
FIGS. 2A-2D illustrate an exemplary fabrication process for forming a peripheral device and a peripheral interconnect layer, according to some embodiments.

Referring to FIG. 8, method 800 starts at operation 802, in which a peripheral device is formed on a first substrate. The first substrate can be a silicon substrate. As illustrated in FIG. 2A, a peripheral device is formed on a first silicon substrate 202. The peripheral device can include a plurality of transistors 204 formed on first silicon substrate 202. Transistors 204 can be formed by a plurality of processing steps including, but not limited to, photolithography, dry/wet etch, thin film deposition, thermal growth, implantation, chemical mechanical polishing (CMP), or any combination thereof. In some embodiments, doped regions 208 are formed in first silicon substrate 202, which function, for example, as source regions and/or drain regions of transistors 204. In some embodiments, an isolation region 206 is also formed in first silicon substrate 202.

Figure 2B:
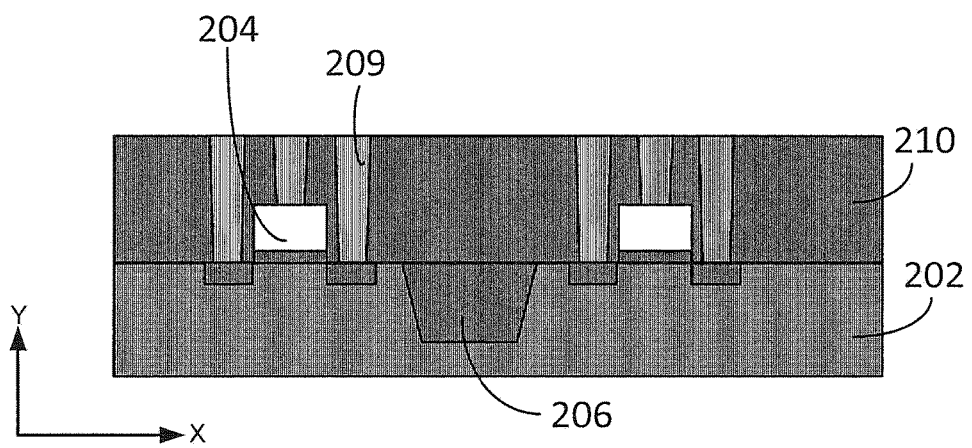

Method 800 proceeds to operation 804, as illustrated in FIG. 8, in which one or more dielectric layers and conductor layers are formed above the peripheral device. As illustrated in FIG. 2B, a first dielectric layer 210 can be formed on first silicon substrate 202. First dielectric layer 210 can include a contact layer 209, including MEOL contacts, to make electrical connections with the peripheral device (e.g., transistors 204).

Figure 2C:
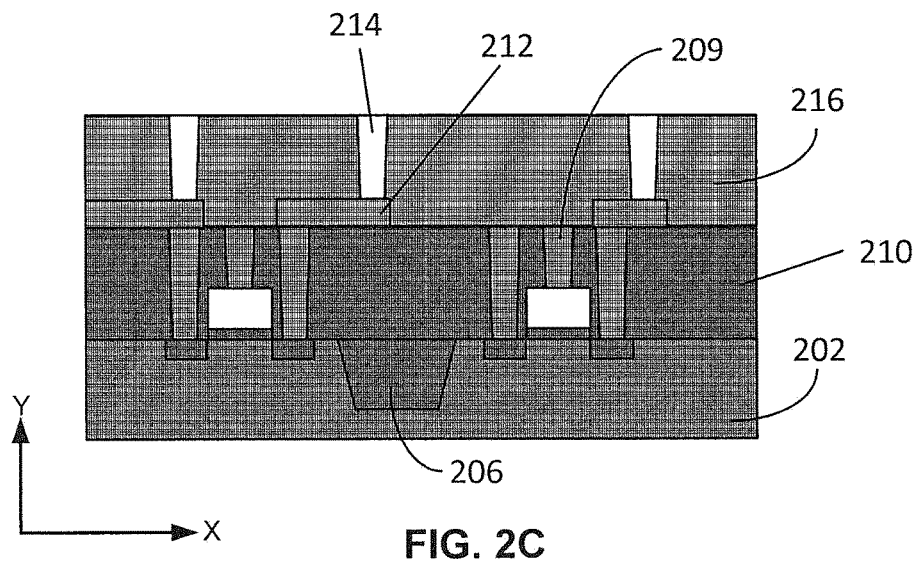

As illustrated in FIG. 2C, a second dielectric layer 216 is formed on first dielectric layer 210. In some embodiments, second dielectric layer 216 is a combination of multiple layers formed in separate steps. For example, second dielectric layer 216 can include a conductor layer 212 and a contact layer 214. The conductor layers (e.g., conductor layer 212) and contact layers (e.g., contact layers 209 and 214) can include conductor materials deposited by one or more thin film deposition processes including, but not limited to, CVD, PVD, ALD, electroplating, electroless plating, or any combination thereof. Fabrication processes to form the conductor layers and contact layers can also include photolithography, CMP, wet/dry etch, or any combination thereof. The dielectric layers (e.g., dielectric layers 210 and 216) can include dielectric materials deposited by one or more thin film deposition processes including, but not limited to, CVD, PVD, ALD, or any combination thereof.

Figure 2D:
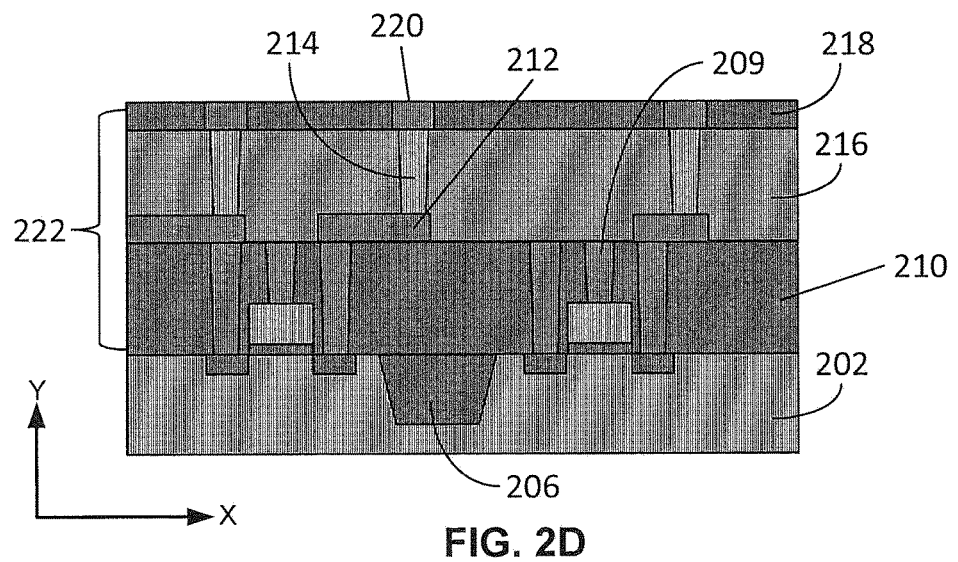

Method 800 proceeds to operation 806, as illustrated in FIG. 8, in which a top dielectric layer and a top conductor layer of a peripheral interconnect layer are formed. The dielectric layers and conductor layers formed at operations 804 and 806 can be collectively referred to as an "interconnect layer" (e.g., the peripheral interconnect layer). Each of the dielectric layers and conductor layers can be a portion of the peripheral interconnect layer that transfers electrical signals to and from the peripheral device. As illustrated in FIG. 2D, a third dielectric layer (the top dielectric layer) 218 is formed on second dielectric layer 216, and a top conductor layer 220 is formed in third dielectric layer 218. As a result, a peripheral interconnect layer 222 is formed. The conductor layers (e.g., conductor layer 220) can include conductor materials deposited by one or more thin film deposition processes including, but not limited to, CVD, PVD, ALD, electroplating, electroless plating, or any combination thereof. Fabrication processes to form the conductor layer and contact layers can also include photolithography, CMP, wet/dry etch, or any combination thereof. The dielectric layers (e.g., dielectric layer 218) can include dielectric materials deposited by one or more thin film deposition processes including, but not limited to, CVD, PVD, ALD, or any combination thereof.

Figure 9:
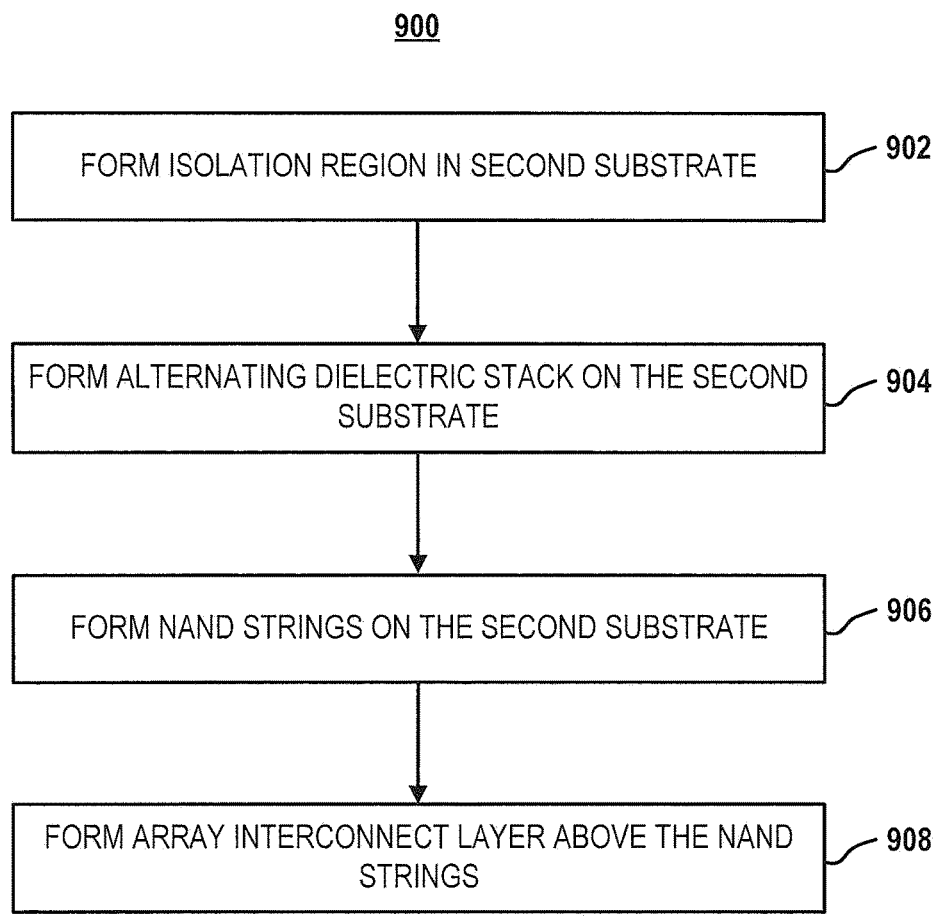
FIG. 9 is a flowchart of an exemplary method for forming an array device and an array interconnect layer, according to some embodiments.

FIGS. 3A-3D illustrate an exemplary fabrication process for forming an array device and an array interconnect layer. FIG. 9 is a flowchart of an exemplary method 900 for forming an array device and an array interconnect layer. An example of the array device and array interconnect layer depicted in FIGS. 3A-3D and FIG. 9 is the array device (e.g., NAND string 130) and array interconnect layer 123 depicted in FIG. 1. It should be understood that the operations shown in method 900 are not exhaustive and that other operations can be performed as well before, after, or between any of the illustrated operations.

Referring to FIG. 9, method 900 starts at operation 902, in which an isolation region is formed in a second substrate. The second substrate can be a silicon substrate, such as a second silicon substrate 302 in FIG. 3A. An array device can be formed on second silicon substrate 302. In some embodiments, an isolation region 304 is formed in second silicon substrate 302. Isolation region 304 can be formed by thermal growth and/or thin film deposition. Patterning process (e.g., photolithography and dry/wet etch) can be used for patterning isolation region 304 in second silicon substrate 302.

Figure 3A:
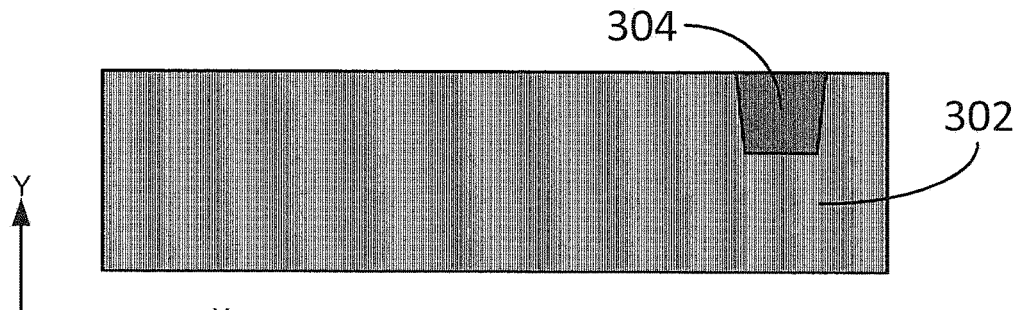
FIGS. 3A-3D illustrate an exemplary fabrication process for forming an array device and an array interconnect layer, according to some embodiments.
Figure 3B:
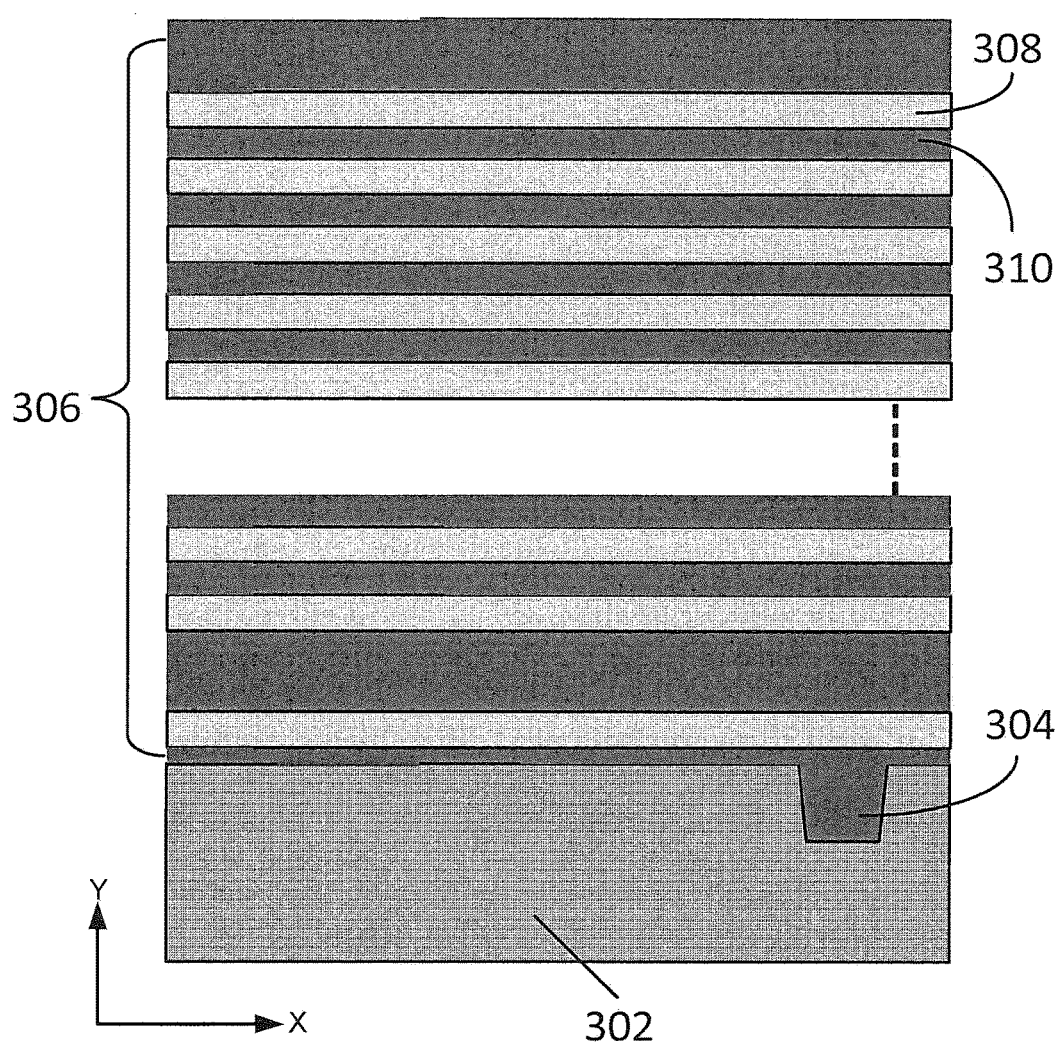

Method 900 proceeds to operation 904, as illustrated in FIG. 9, in which a plurality of dielectric layer pairs (also referred to herein as an "alternating dielectric stack") are formed on the second substrate. As illustrated in FIG. 3B, a plurality of first dielectric layer 308 and second dielectric layer 310 pairs are formed on second silicon substrate 302. The plurality of dielectric pairs can form an alternating dielectric stack 306. Alternating dielectric stack 306 can include an alternating stack of a first dielectric layer 308 and a second dielectric layer 310 that is different from first dielectric layer 308. In some embodiments, each dielectric layer pair includes a layer of silicon nitride and a layer of silicon oxide. In some embodiments, there are more layers than the dielectric layer pairs made of different materials and/or with different thicknesses in alternating dielectric stack 306. In some embodiments, first dielectric layers 308 can each have the same thickness or have different thicknesses. Similarly, second dielectric layers 310 can each have the same thickness or have different thicknesses. In one example, for a first plurality of dielectric pairs in alternating dielectric stack 306, the thickness of each first dielectric layer 308 and second dielectric layer 310 can be between about 5 nm and about 40 nm (e.g., between 5 nm and 40 nm). For a second plurality of dielectric pairs in alternating dielectric stack 306, the thickness of each first dielectric layer 308 and second dielectric layer 310 can be between about 10 nm and about 40 nm (e.g., between 10 nm and 40 nm). For a third plurality of dielectric pairs in alternating dielectric stack 306, the thickness of each first dielectric layer 308 can be between about 5 nm and about 40 nm (e.g., between 5 nm and 40 nm), and the thickness of each second dielectric layer 310 can be between about 50 nm and about 200 nm (e.g., between 50 nm and 200 nm). Alternating dielectric stack 306 can be formed by one or more thin film deposition processes including, but not limited to, CVD, PVD, ALD, or any combination thereof. In some embodiments, alternating dielectric stack 306 can be replaced by a plurality of conductor/dielectric layer pairs, i.e., an alternating stack of a conductor layer (e.g., polysilicon) and a dielectric layer (e.g., silicon oxide).

Figure 3C:
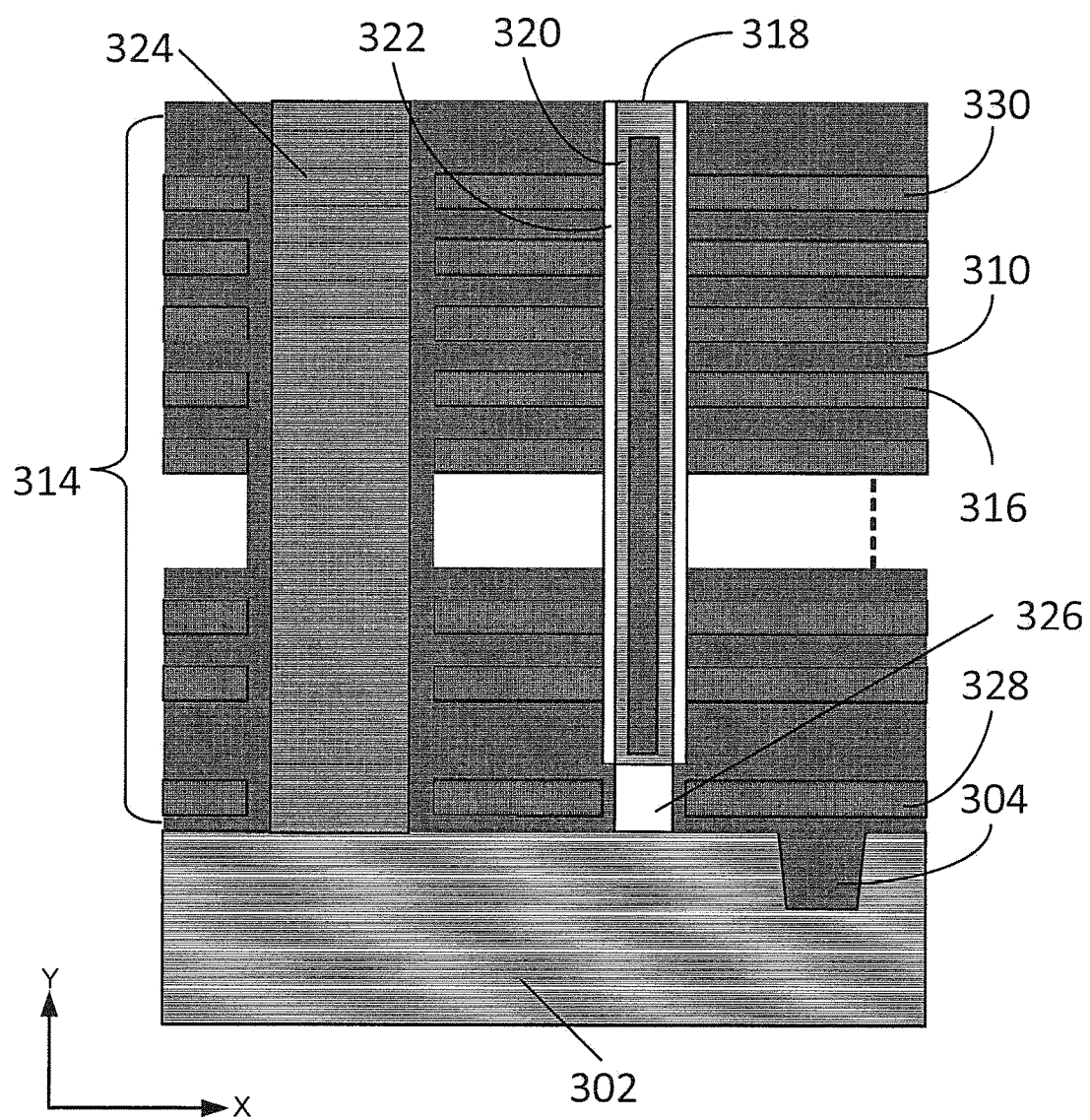

Method 900 proceeds to operation 906, as illustrated in FIG. 9, in which a plurality of NAND strings of the array device are formed on the second substrate. As illustrated in FIG. 3C, NAND string 318 is formed on second silicon substrate 302. Each first dielectric layer 308 of alternating dielectric stack 306 can be replaced by a conductor layer 316, thereby forming a plurality of conductor/dielectric layer pairs in an alternating conductor/dielectric stack 314. The replacement of first dielectric layers 308 with conductor layers 316 can be performed by wet etching first dielectric layers 308 selective to second dielectric layers 310 and filling the structure with conductor layers 316. The thickness of each conductor layer 316 can be between about 5 nm and about 40 nm (e.g., between 5 nm and 40 nm). Conductor layers 316 can include conductor materials including, but not limited to, W, Co, Cu, Al, doped silicon, polysilicon, silicides, or any combination thereof. Conductor layers 316 can be filled by thin film deposition processes, such as CVD, ALD, any other suitable process, or any combination thereof.

In some embodiments, conductor layers 316 in alternating conductor/dielectric stack 314 are used to form the select gates and word lines for NAND string 318. At least some of conductor layers 316 in alternating dielectric stack 306 (e.g., except the top and bottom conductor layers 316) can each be used as a word line for NAND string 318. As illustrated in FIG. 3C, the top conductor layer (the uppermost conductor layer) and the bottom conductor layer (the lowermost conductor layer) in alternating conductor/dielectric stack 314 can each be patterned to form a drain select gate 330 and a source select gate 328, respectively, for NAND string 318. In some embodiments, one or more pairs of first dielectric layer 308 and second dielectric layer 310 at the upper end of alternating dielectric stack 306 are patterned, and first dielectric layer 308 in the top patterned dielectric layer pairs can be replaced with a corresponding conductor layer 316, thereby forming drain select gate 330. In some embodiments, an additional conductor layer is formed on top of alternating conductor/dielectric stack 314 and is patterned to form the drain select gate for NAND string 318.

In some embodiments, fabrication processes to form NAND string 318 further include forming a semiconductor channel 320 that extends vertically through alternating conductor/dielectric stack 314. In some embodiments, fabrication processes to form NAND string 318 further include forming a dielectric layer 322 between semiconductor channel 320 and the plurality of conductor/dielectric layer pairs in alternating conductor/dielectric stack 314. Dielectric layer 322 can be a composite dielectric layer, such as a combination of multiple dielectric layers including, but not limited to, a tunneling layer, a storage layer, and a blocking layer.

The tunneling layer can include dielectric materials including, but not limited to, silicon oxide, silicon nitride, silicon oxynitride, or any combination thereof. Electrons or holes from the semiconductor channel can tunnel to a storage layer of NAND string 318 through the tunneling layer. The thickness of the tunneling layer (e.g., in the radial direction of NAND string 318) can be between about 5 nm and about 15 nm (e.g., between 5 nm and 15 nm). The storage layer can include materials for storing charge for memory operation. The storage layer materials include, but are not limited to, silicon nitride, silicon oxynitride, a combination of silicon oxide and silicon nitride, or any combination thereof. The thickness of the storage layer (e.g., in the radial direction of NAND string 318) can be between about 3 nm and about 15 nm (e.g., between 3 nm and 15 nm). The blocking layer can include dielectric materials including, but not limited to, silicon oxide or a combination of silicon oxide/silicon nitride/silicon oxide (ONO) with a thickness between about 4 nm and about 15 nm (e.g., between 4 nm and 15 nm). The blocking layer can further include a high-k dielectric layer, such as a $Al_2O_3$ layer with a thickness between about 1 nm and about 5 nm (e.g., between 1 nm and 5 nm). Dielectric layer 322 can be formed by processes such as ALD, CVD, PVD, any other suitable processes, or any combination thereof.

In some embodiments, fabrication processes to form NAND string 318 further include forming an epitaxial layer 326 at an end of NAND string 318. As illustrated in FIG. 3C, epitaxial layer 326 can be formed at a lower end of NAND string 318 as an epitaxial plug. Epitaxial layer 326 can be a silicon layer in contact with and epitaxially grown from second silicon substrate 302 and can be implanted to a desired doping level.

In some embodiments, operation 906 further includes forming one or more source contacts (e.g., a common source contact). As illustrated in FIG. 3C, a source contact 324 that extends vertically through alternating conductor/dielectric stack 314 can be formed on second silicon substrate 302. Source contact 324 can have an end in contact with second silicon substrate 302. In some embodiments, source contact 324 can be electrically connected to multiple NAND strings 318 by second silicon substrate 302. Select gate 328 can be formed at the lower end of NAND string 318 to turn on and turn off epitaxial layer 326 as a switch. In some embodiments, epitaxial layer 326 extends vertically through the partial or entire thickness of select gate 328. Source contact 324 can include conductor materials including, but not limited to, W, Co, Cu, Al, doped silicon, silicides, or any combination thereof. Source contact 324 can be formed by a dry/wet etch process to form a vertical opening through alternating conductor/dielectric stack 314, followed by a fill process to fill the opening with conductor materials and other materials (e.g., dielectric materials.) The opening can be filled by ALD, CVD, PVD, electroplating, any other suitable processes, or any combination thereof.

Figure 3D:
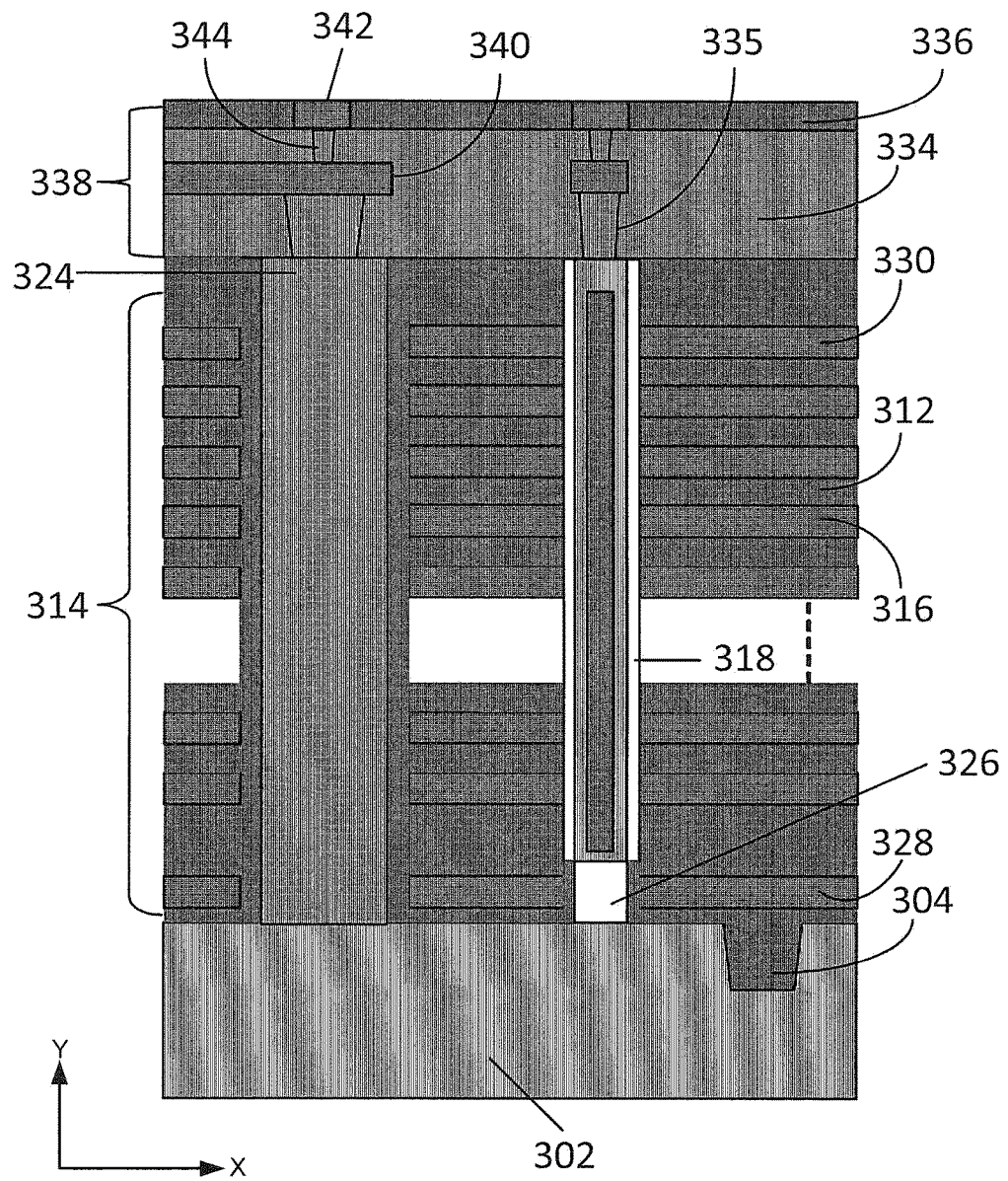

Method 900 proceeds to operation 908, as illustrated in FIG. 9, in which an array interconnect layer is formed above the plurality of NAND strings. The array interconnect layer can transfer electrical signals between the NAND strings and other parts of the 3D memory device, such as the peripheral device. As illustrated in FIG. 3D, an array interconnect layer 338 is formed above NAND string 318. In some embodiments, fabrication processes to form array interconnect layer 338 include forming a dielectric layer 334, followed by forming a bit line contact 335 in contact with NAND string 318 in dielectric layer 334. Dielectric layer 334 can include one or more layers of dielectric materials such as silicon oxide, silicon nitride, silicon oxynitride, or any combination thereof. Bit line contact 335 can be formed by forming an opening in dielectric layer 334, followed by filling the opening with conductor materials and dielectric materials. Bit line contact 335 can include conductor materials including, but not limited to, W, Co, Cu, Al, doped silicon, silicides, or any combination thereof. The opening of bit line contact 335 can be filled with conductor materials and dielectric materials by ALD, CVD, PVD, any other suitable processes, or any combination thereof.

In some embodiments, fabrication processes to form array interconnect layer 338 further include forming one or more conductor layers (e.g., a conductor layer 340) and one or more contact layers (e.g., contact layer 344) in dielectric layer 334. Conductor layer 340 and contact layer 344 can include conductor materials including, but not limited to, W, Co, Cu, Al, doped silicon, silicides, or any combination thereof. Conductor layer 340 and conductor contact layer 344 can be formed by any suitable known BEOL methods.

In some embodiments, fabrication processes to form array interconnect layer 338 further include forming a top conductor layer 342 and a top dielectric layer 336. Top conductor layer 342 can include conductor materials including, but not limited to, W, Co, Cu, Al, doped silicon, silicides, or any combination thereof. Dielectric layer 336 can include dielectric materials including, but not limited to, silicon oxide, silicon nitride, silicon oxynitride, or any combination thereof.

Figure 4:
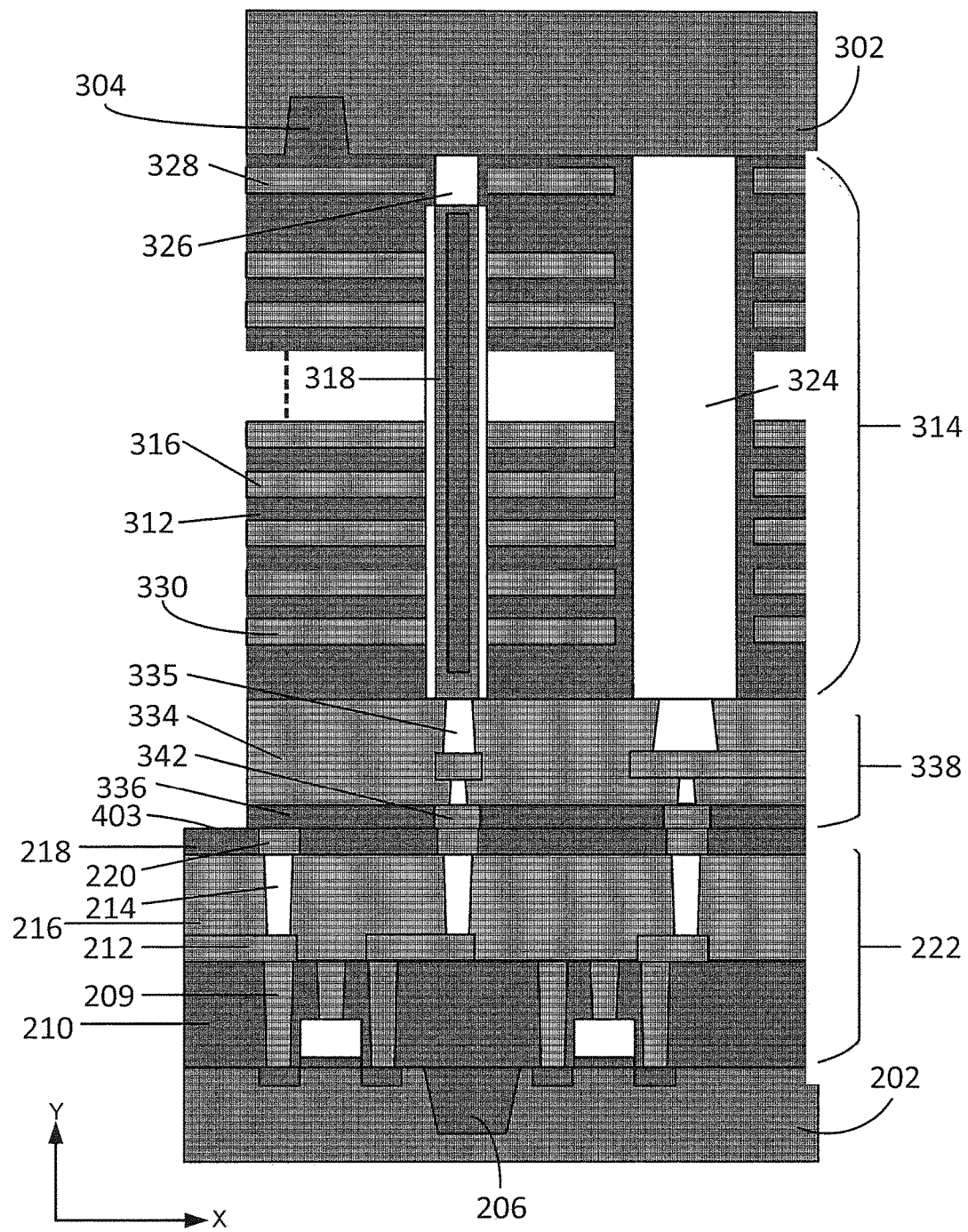
FIG. 4 illustrates an exemplary fabrication process for joining an array device and a peripheral device, according to some embodiments.
Figure 6A:
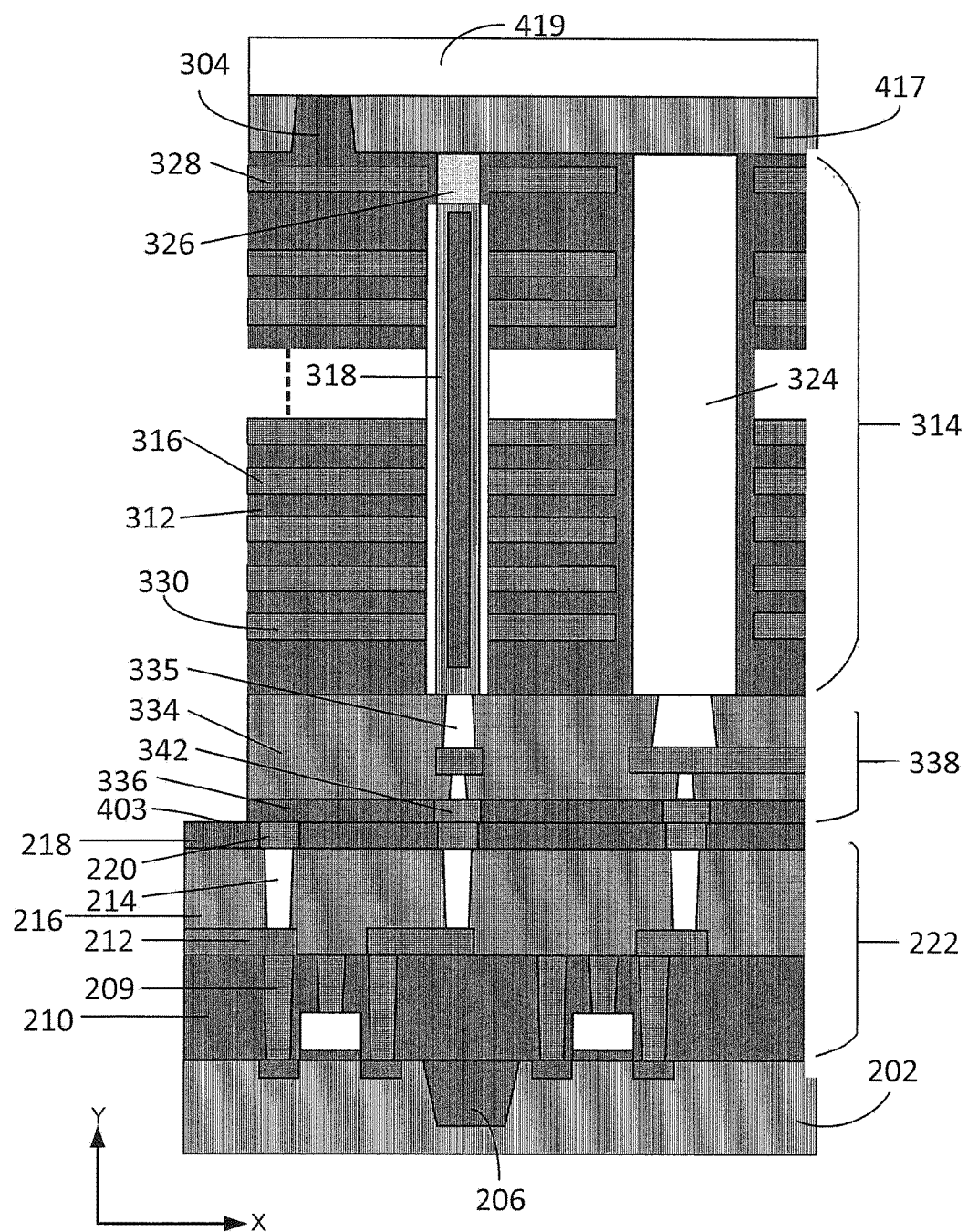
FIGS. 6A-6B illustrate another exemplary fabrication process for forming a source conductor layer, according to some embodiments.
Figure 6B:
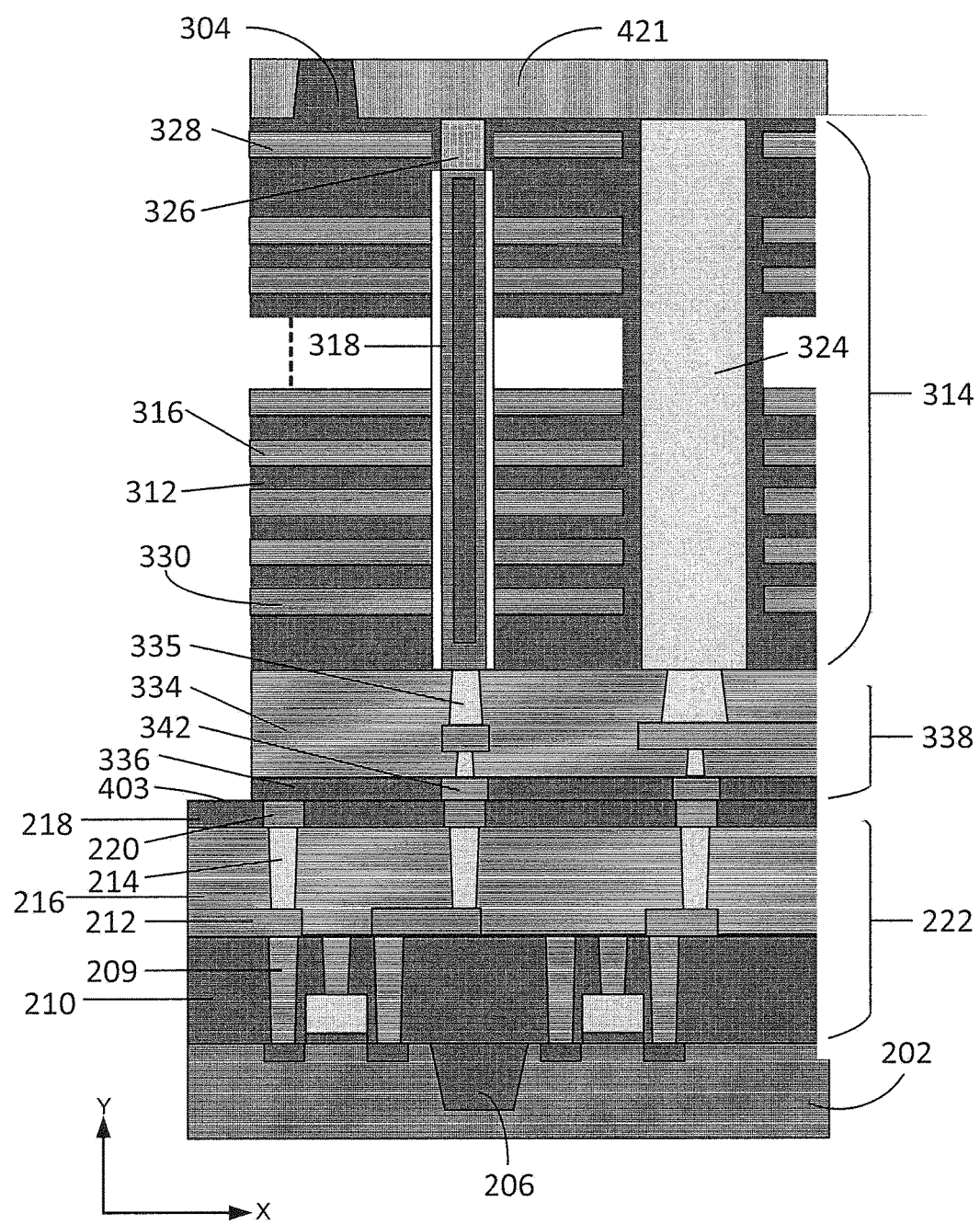
Figure 7:
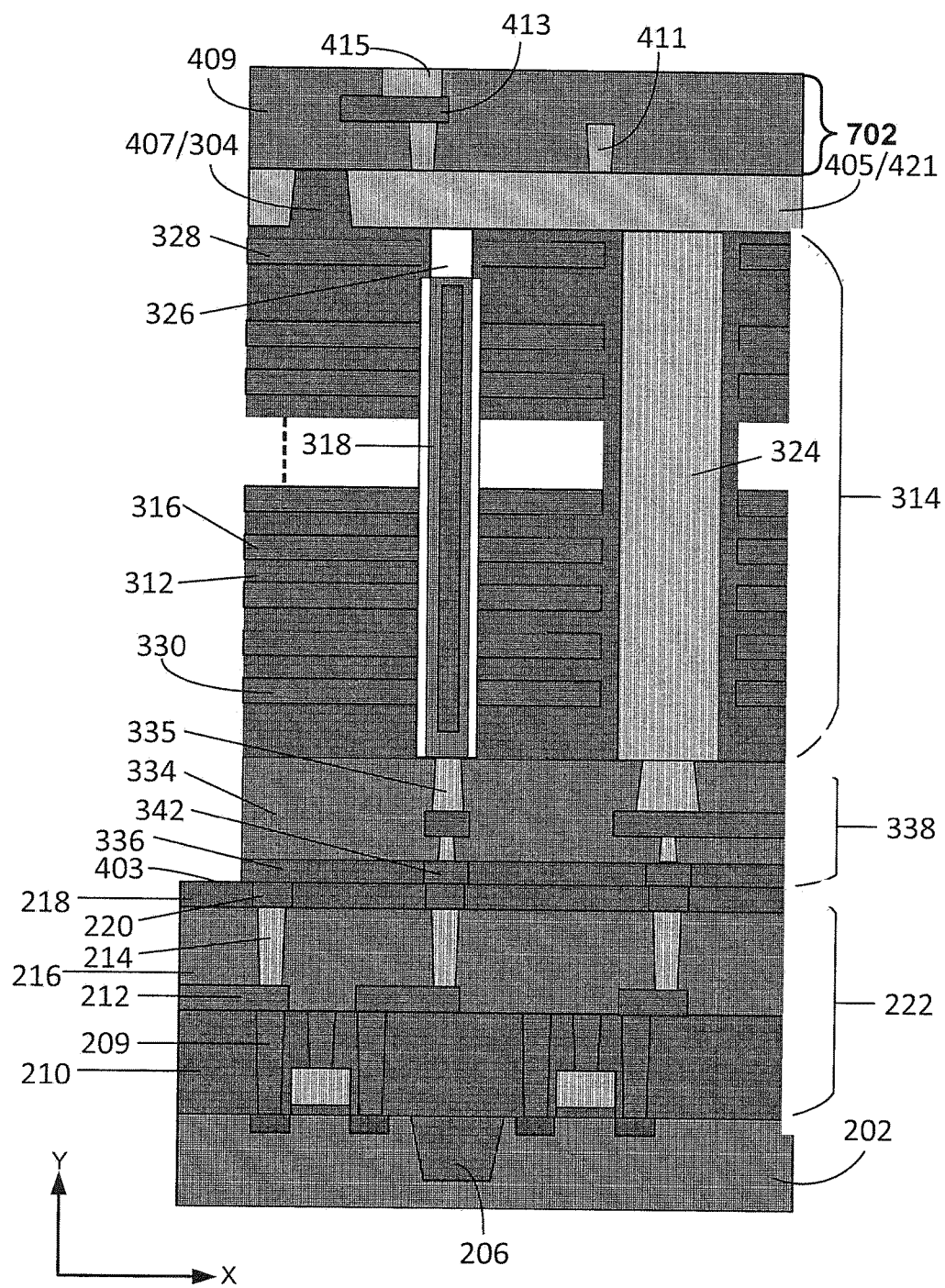
FIG. 7 illustrates an exemplary fabrication process for forming a BEOL interconnect layer on a source conductor layer, according to some embodiments.
Figure 10:
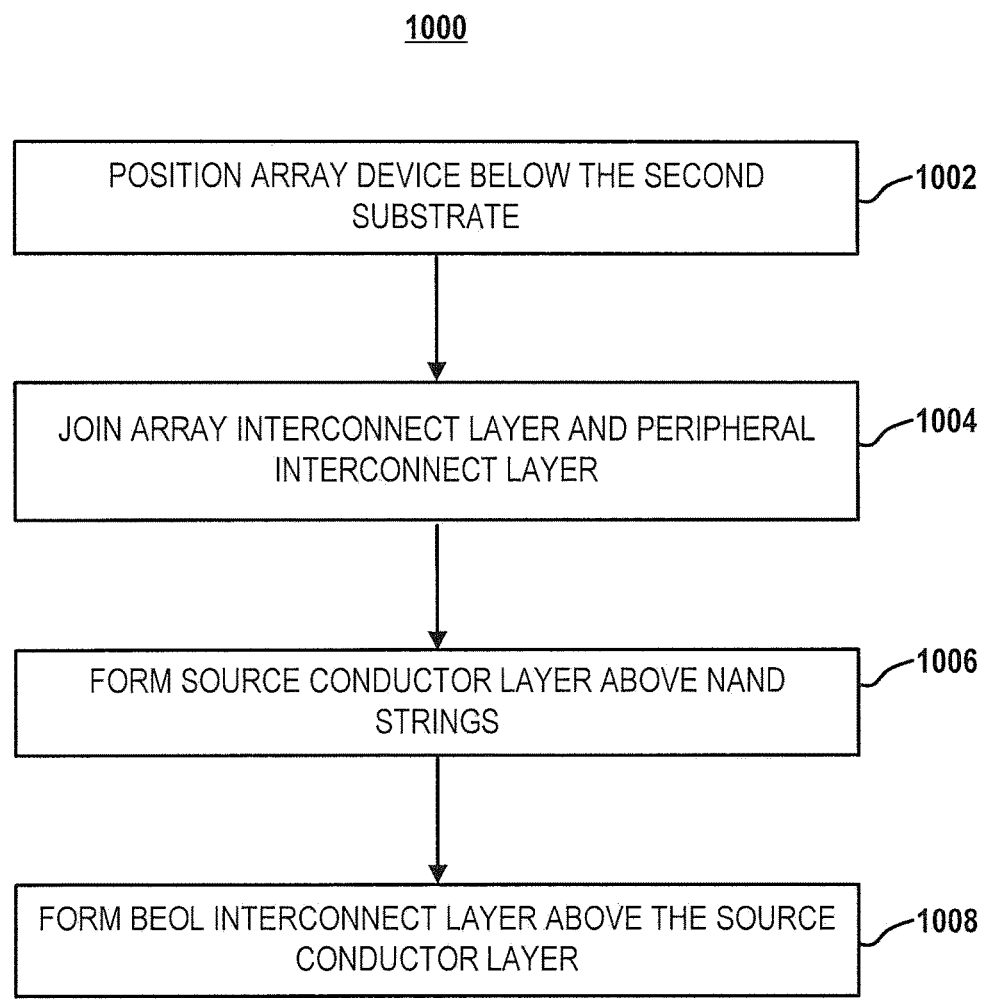
FIG. 10 is a flowchart of an exemplary method for forming a 3D memory device with an array device and a peripheral device, according to some embodiments.

FIG. 4 illustrates an exemplary fabrication process for joining an array device and a peripheral device. FIGS. 5A-5B and FIGS. 6A-6B illustrate various exemplary fabrication processes for forming a source conductor layer. FIG. 7 illustrates an exemplary fabrication process for forming a BEOL interconnect layer on a source conductor layer. FIG. 10 is a flowchart for an exemplary method 1000 for forming a 3D memory device with an array device and a peripheral device. An example of the 3D memory device and the source conductor layer depicted in FIGS. 4-7 is 3D memory device 100 and source conductor layer 144 depicted in FIG. 1. It should be understood that the operations shown in method 1000 are not exhaustive and that other operations can be performed as well before, after, or between any of the illustrated operations.

Referring to FIG. 10, method 1000 starts at operation 1002, in which the array device (and the array interconnect layer) is positioned below the second substrate (e.g., by flipping the second substrate upside down), and the array interconnect layer is aligned with the peripheral interconnect layer. As illustrated in FIG. 4, array interconnect layer 338 can be placed below second silicon substrate 302. In some embodiments, aligning array interconnect layer 338 with peripheral interconnect layer 222 is performed by aligning conductor layer 342 of array interconnect layer 338 with conductor layer 220 of peripheral interconnect layer 222. As a result, conductor layer 342 can contact conductor layer 220 when the array device is joined with the peripheral device.

Method 1000 proceeds to operation 1004, as illustrated in FIG. 10, in which the array interconnect layer is joined with the peripheral interconnect layer. The array interconnect layer can be joined with the peripheral interconnect layer by flip-chip bonding the first and second substrates. In some embodiments, the array interconnect layer and the peripheral interconnect layer are joined by hybrid bonding of the first substrate and the second substrate in a face-to-face manner, such that the array interconnect layer is above and in contact with the peripheral interconnect layer in the resulting 3D memory device. Hybrid bonding (also known as "metal/dielectric hybrid bonding") can be a direct bonding technology (e.g., forming bonding between surfaces without using intermediate layers, such as solder or adhesives), which obtains metal-metal bonding and dielectric-dielectric bonding simultaneously. As illustrated in FIG. 4, array interconnect layer 338 can be joined with peripheral interconnect layer 222, thereby forming a bonding interface 403.

A treatment process can be used to enhance the bonding strength between array interconnect layer 338 and peripheral interconnect layer 222 before or during the joining process of the two interconnect layers. In some embodiments, each of dielectric layer 336 and dielectric layer 218 includes silicon oxide or silicon nitride. In some embodiments, the treatment process includes a plasma treatment that treats the surfaces of array interconnect layer 338 and peripheral interconnect layer 222 so that the surfaces of the two interconnect layers form chemical bonds between dielectric layer 336 and dielectric layer 218. In some embodiments, the treatment process includes a wet process that treats the surfaces of array interconnect layer 338 and peripheral interconnect layer 222 so that the surfaces of the two interconnect layers form chemical bonds to enhance the bonding strength between two dielectric layers 336 and 218. In some embodiments, the treatment process includes a thermal process that can be performed at a temperature from about 250° C. to about 600° C. (e.g., from 250° C. to 600° C.). The thermal process can cause inter-diffusion between conductor layer 342 and conductor layer 220. As a result, conductor layer 342 can be inter-mixed with conductor layer 220 after the joining process. Conductor layer 342 and conductor layer 220 can each include Cu.

Method 1000 proceeds to operation 1006, as illustrated in FIG. 10, in which a source conductor layer is formed above the NAND strings. The second substrate on which the alternating conductor/dielectric stack (and the NAND strings therein) is formed can be removed after the joining process, and the source conductor layer can be formed on the alternating conductor/dielectric stack (and the NAND strings therein). That is, the source conductor layer can replace the second substrate after the joining process by being formed at the original location of the second substrate (e.g., on the alternating conductor/dielectric stack). In some embodiments, the source conductor layer can be patterned to form one or more isolation regions.

Figure 5A:
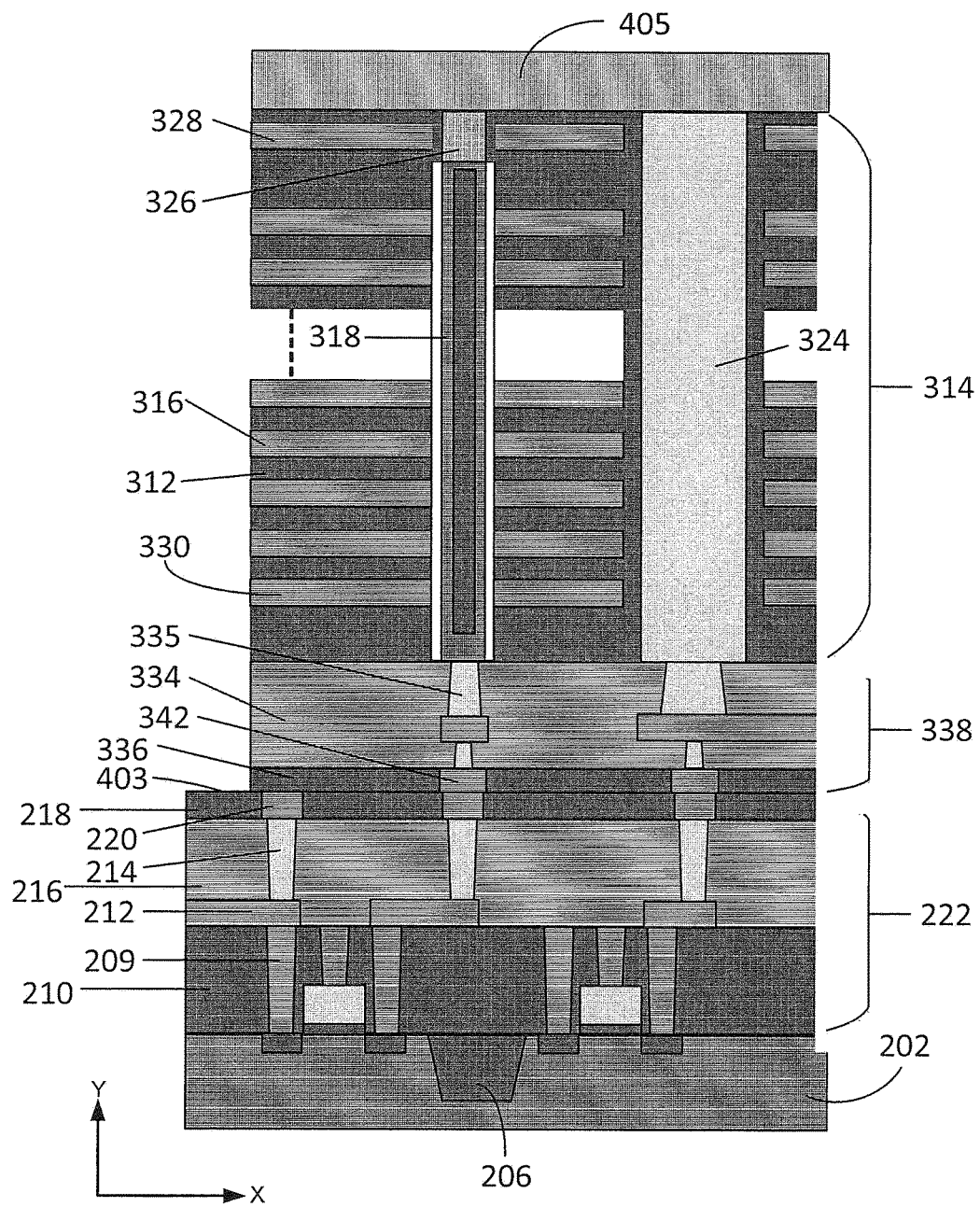
FIGS. 5A-5B illustrate an exemplary fabrication process for forming a source conductor layer, according to some embodiments.

As illustrated in FIG. 5A, in some embodiments, second silicon substrate 302 (as shown in FIG. 4) has been removed, and a source conductor layer 405 is formed on alternating conductor/dielectric stack 314. In other words, source conductor layer 405 can replace second silicon substrate 302 at the original location of second silicon substrate 302. Source conductor layer 405 can include conductive materials, so that the conductance of source conductor layer 405 cannot be affected by source select gate 328 below source conductor layer 405. The conductive materials in source conductor layer 405 can provide electrical connections between source contact 324 and NAND string 318. The conductive materials in source conductor layer 405 can include, but is not limited to, metals, metal alloys, and metal silicides. In some embodiments, source conductor layer 405 includes one or more metals, such as Cu, Co, Ni, Ti, W, or any other suitable metals. In some embodiments, source conductor layer 405 includes one or more metal alloys, each of which is an alloy of at least two of Cu, Co, Ni, Ti, W (e.g., TiNi alloy or a combination of TiNi alloy and TiW alloy), or any other suitable metal alloys. In some embodiments, source conductor layer 405 includes one or more metal silicides, such as copper silicide, cobalt silicide, nickel silicide, titanium silicide, tungsten silicide, or any other suitable metal silicides.

In some embodiments, source conductor layer 405 has a thickness between about 20 nm and about 50 µm, such as between 20 nm and 50 µm (e.g., 20 nm, 30 nm, 40 nm, 50 nm, 60 nm, 70 nm, 80 nm, 90 nm, 100 nm, 110 nm, 120 nm, 130 nm, 140 nm, 150 nm, 160 nm, 170 nm, 180 nm, 190 nm, 200 nm, 500 nm, 1 µm, 5 µm, 10 µm, 15 µm, 20 µm, 25 µm, 30 µm, 35 µm, 40 µm, 45 µm, 50 µm, any range bounded on the lower end by any of these values, or in any range defined by any two of these values). In some embodiments, source conductor layer 405 has a thickness between about 200 nm and about 5 µm, such as between 200 nm and 5 µm (e.g., 200 nm, 300 nm, 400 nm, 500 nm, 600 nm, 700 nm, 800 nm, 900 nm, 1 µm, 2 µm, 3 µm, 4 µm, 5 µm, any range bounded on the lower end by any of these values, or in any range defined by any two of these values). Source conductor layer 405 can be formed by one or more thin film deposition processes including, but not limited to, CVD, PVD, and ALD.

Figure 11:
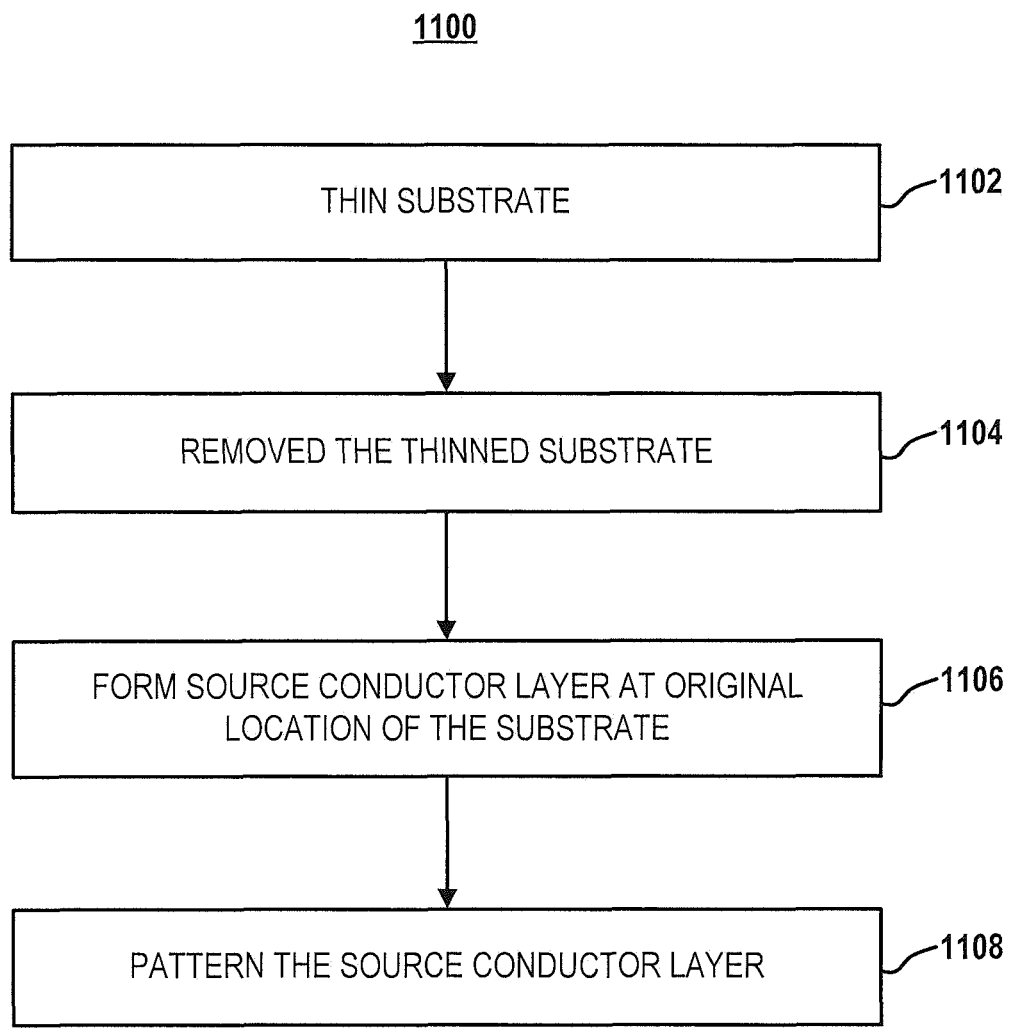
FIG. 11 is a flowchart of an exemplary method for forming a source conductor layer, according to some embodiments.

FIG. 11 is a flowchart of an exemplary method for forming the source conductor layer. It should be understood that the operations shown in method 1100 are not exhaustive and that other operations can be performed as well as before, after, or between any of the illustrated operations. Referring to FIG. 11, method 1100 starts at operation 1102, in which the second substrate is thinned. For example, second silicon substrate 302 (in FIG. 4) can be thinned to become a thinned silicon substrate. In some embodiments, second silicon substrate 302 can be thinned from the top surface (opposite to the bottom surface that is in contact with alternating conductor/dielectric stack 314) until isolation region 304 is exposed. That is, the thickness of the thinned second substrate can be the same as that of the isolation region formed in the second substrate.

Method 1100 proceeds to operation 1104, as illustrated in FIG. 11, in which the thinned second substrate is removed. The thinned second substrate can be removed by grinding, wet/dry etching, CMP, or any combination thereof. It is understood that in some embodiments, operation 1102 can be skipped, and the second substrate (e.g., second silicon substrate 302 in FIG. 4) can be removed in a single process without being thinned first.

Method 1100 proceeds to operation 1106, as illustrated in FIG. 11, in which a source conductor layer is formed at the original location of the second substrate that has been removed. As illustrated in FIG. 5A, source conductor layer 405 can be formed on alternating conductor/dielectric stack 314, so that the bottom surface of source conductor layer 405 can be in contact with the top dielectric layer of alternating conductor/dielectric stack 314 as well as the upper end of NAND string 318 (e.g., epitaxial layer 326) and the upper end of source contact 324.

Figure 5B:
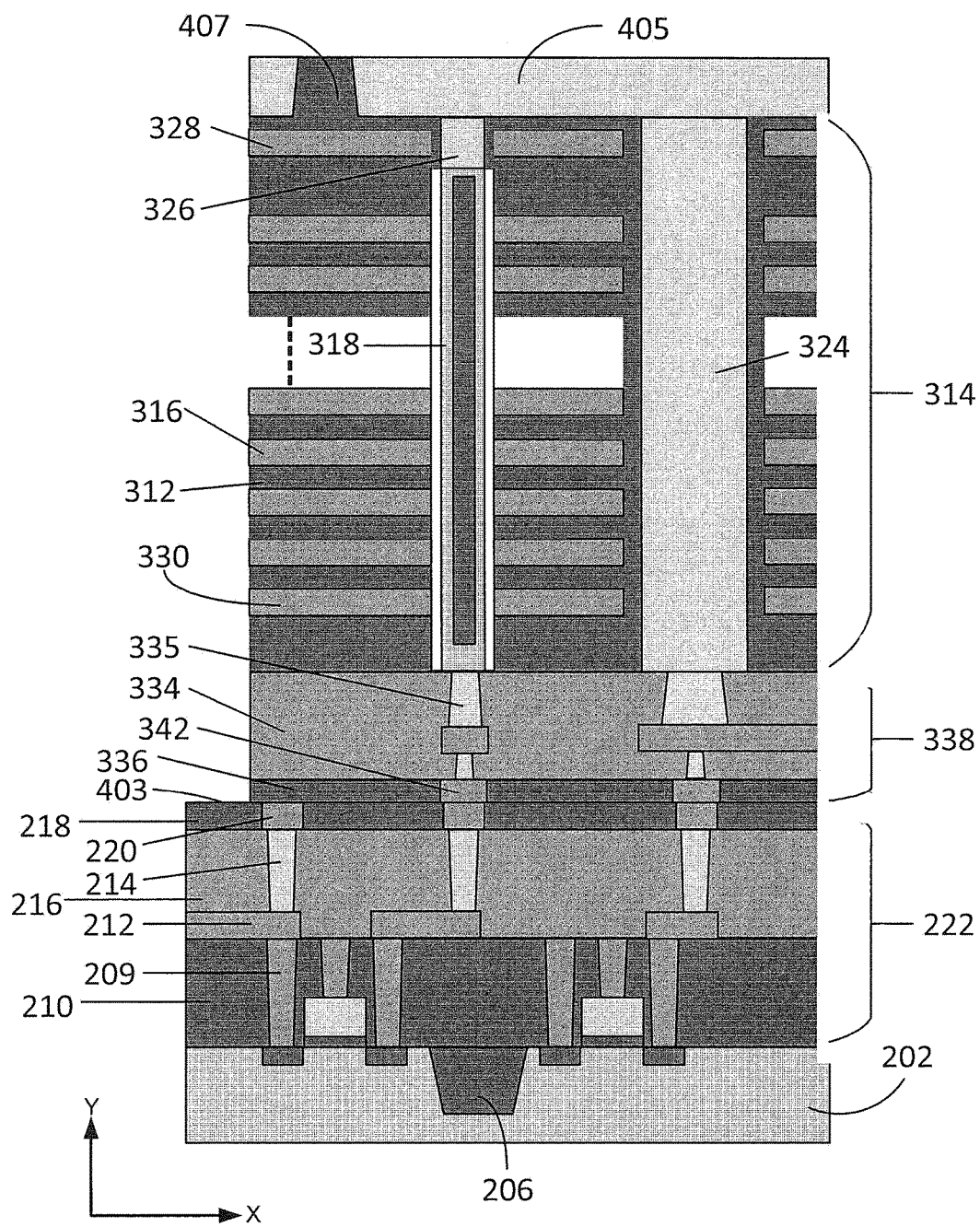

Method 1100 proceeds to operation 1108, as illustrated in FIG. 11, in which the source conductor layer is patterned. In some embodiments, the source conductor layer is patterned to form one or more isolation regions. The remaining conductive materials in the source conductor layer can become conduction regions electrically isolated by the isolation regions. As illustrated in FIG. 5B, an isolation region 407 can be formed in source conductor layer 405. Isolation region 407 can include dielectric materials including, but not limited to, silicon oxide, silicon nitride, silicon oxynitride, doped silicon oxide, any other suitable dielectric materials, or any combination thereof. Patterning process (e.g., photolithography and dry/wet etch) can be used for patterning isolation region 407 in source conductor layer 405. Isolation region 407 can then be formed by thermal growth and/or thin film deposition of dielectric materials in the patterned region. Source conductor layer 405 can be patterned to form any suitable layout with different numbers of conduction regions and isolation regions in different arrangements. The different layouts of conduction regions and isolation regions in source conductor layer 405 can be used to drive the memory array in various configurations, such as an array of NAND strings in a single memory block, in multiple memory blocks, or in a portion of a memory block (e.g., one or more memory fingers). The conduction regions formed in source conductor layer 405 can provide additional electrical connections—besides electrical connections between NAND string 318 and source contact 324—such as electrical connections between the peripheral device and the BEOL interconnects and between the array device and the BEOL interconnects.

Figure 12:
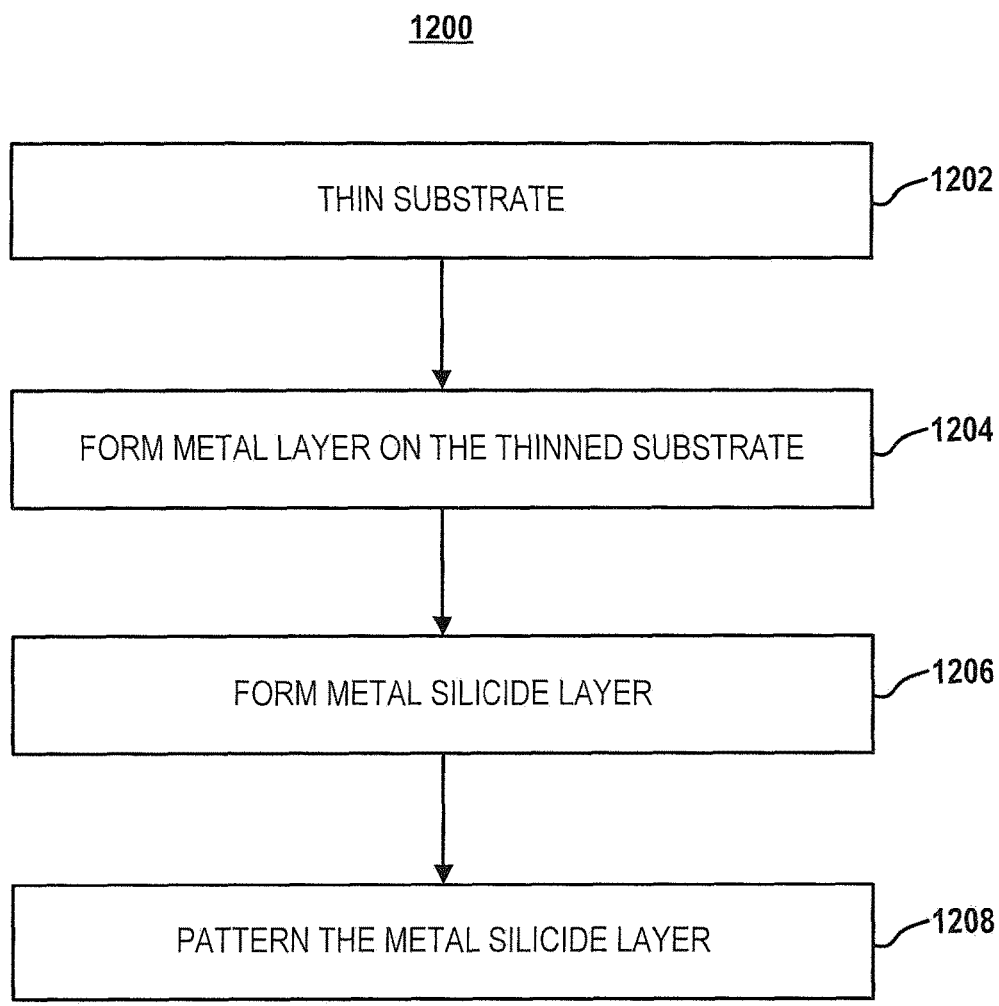
FIG. 12 is a flowchart of another exemplary method for forming a source conductor layer, according to some embodiments.

FIG. 12 is a flowchart of another exemplary method for forming the source conductor layer. It should be understood that the operations shown in method 1200 are not exhaustive and that other operations can be performed as well as before, after, or between any of the illustrated operations. Referring to FIG. 12, method 1200 starts at operation 1202, in which the second substrate is thinned. For example, second silicon substrate 302 (in FIG. 4) can be thinned to become a thinned second silicon substrate 417 (in FIG. 6A). In some embodiments, second silicon substrate 302 can be thinned from its upper side (opposite to its bottom side on which NAND string 318 is formed) until isolation region 304 is exposed. That is, the thickness of thinned second silicon substrate 417 can be the same as that of isolation region 304 formed in second silicon substrate 302. The second substrate can be thinned by grinding, wet/dry etching, CMP, or any combination thereof.

Method 1200 proceeds to operation 1204, as illustrated in FIG. 12, in which a metal layer is formed on the thinned second substrate. As illustrated in FIG. 6A, a metal layer 419 can be formed on the upper side of thinned second silicon substrate 417. Metal layer 419 can include Co, Ni, Ti, W, any other suitable metal that can form metal silicides, or any combination thereof. Metal layer 419 can be formed by one or more thin film deposition processes including, but not limited to, CVD, PVD, ALD, or any combination thereof. In some embodiments, the thickness of metal layer 419 is at least about 2 nm (e.g., at least 2 nm), such as between about 2 nm and about 500 nm (e.g., between 2 nm and 500 nm). The thickness of metal layer 419 can be thick enough for the subsequent silicidation process.

Method 1200 proceeds to operation 1206, as illustrated in FIG. 12, in which a metal silicide layer is formed. The metal silicide layer can be formed based on a reaction of silicon in the thinned second substrate and metal in the metal layer. As illustrated in FIG. 6B, a source conductor layer 421 can be a metal silicide layer formed by the silicidation process based on the reaction of thinned second silicon substrate 417 and metal layer 419. The metal silicide layer can be formed by a thermal treatment (e.g., annealing, sintering, or any other suitable process), resulting in the formation of metal-silicon alloy (silicide). The annealing process can include, for example, rapid thermal annealing (RTA) and laser annealing. The dielectric materials in isolation region 304 cannot react with metal in metal layer 419. Thus, isolation region 304 can remain in source conductor layer 421. In some embodiments, the unreacted portion of metal layer 419 after the silicidation process can be removed from source conductor layer 421. The removal of the unreacted portion of metal layer 419 can be performed by a wet etch process, a dry etch process, or any other suitable process.

The metal silicide materials in source conductor layer 421 can depend on the metal materials in metal layer 419. For example, if metal layer 419 includes Co, Ni, Ti, or W, then source conductor layer 421 includes cobalt silicide, nickel silicide, titanium silicide, or tungsten silicide, respectively. In some embodiments, the metal silicide materials in source conductor layer 421 are conductive materials with an electrical conductivity that is high enough so that the conduction of source conductor layer 421 cannot be affected by source select gate 328, and source conductor layer 421 can electrically connect NAND string 318 and source contact 324. In some embodiments, the electrical conductivity of the metal silicide materials in source conductor layer 421 is at least about $1\times10^4$ S/m at about 20° C. (e.g., at least $1\times10^4$ S/m at 20° C.), such as between about $1\times10^4$ S/m and about $1\times10^7$ S/m at about 20° C. (e.g., between $1\times10$ S/m and $1\times10^7$ S/m at 20° C.).

As illustrated in FIG. 6B, isolation region 304 formed prior to the formation of source conductor layer 421 can remain in source conductor layer 421, while the conduction regions electrically isolated by isolation region 304 include the metal silicides formed by the silicidation process. That is, in some embodiments, the conduction regions and isolation regions in source conductor layer 421 can be patterned prior to the formation of the metal silicide layer (e.g., operation 902 in method 900). In some embodiments, additional patterning is performed after the formation of the metal silicide layer (i.e., by patterning source conductor layer 421 directly) to form additional isolation regions (not shown in FIG. 6B). For example, method 1200 proceeds to operation 1208, as illustrated in FIG. 12, in which the metal silicide layer is patterned to form isolation regions and conduction regions electrically isolated by the isolation region. It is understood that in some embodiments, the isolation regions in the second substrate (e.g., isolation region 304) may not be necessary, and the isolation regions in source conductor layer 421 can be formed by patterning source conductor layer 421 after the silicidation process.

Patterning process (e.g., photolithography and dry/wet etch) can be used for patterning source conductor layer 421 after the formation of the metal silicide layer. Isolation regions then can be formed by thermal growth and/or thin film deposition of dielectric materials in the patterned region. Isolation regions can include dielectric materials, such as silicon oxide, silicon nitride, silicon oxynitride, doped silicon oxide, any other suitable dielectric materials, or any combination thereof. The layout of multiple conduction regions can be defined after the formation of the isolation regions in source conductor layer 421. The different layouts of conduction regions and isolation regions in source conductor layer 421 can be used to drive the memory array in various configurations, such as an array of NAND strings in a single memory block, in multiple memory blocks, or in a portion of a memory block (e.g., one or more memory fingers). The conduction regions formed in source conductor layer 421 can provide additional electrical connections besides between NAND string 318 and source contact 324, such as between the peripheral device and the BEOL interconnects and between the array device and the BEOL interconnects.

Referring back to FIG. 10, method 1000 proceeds to operation 1008, in which a BEOL interconnect layer is formed above the source conductor layer. As illustrated in FIG. 7, a BEOL interconnect layer 702 is formed above source conductor layer 405/421. BEOL interconnect layer 702 can include a dielectric layer 409, one or more contact layers 411, one or more conductor layers 413, and a pad layer 415. Dielectric layer 409 can be a combination of multiple dielectric layers formed at separate process steps. Contact layer 411, conductor layer 413, and pad layer 415 can include conductor materials including, but not limited to, W, Co, Cu, Al, doped silicon, silicides, or any combination thereof. Dielectric layer 409 can include dielectric materials including, but not limited to, silicon oxide, silicon nitride, silicon oxynitride, low-k dielectrics, or any combination thereof. In some embodiments, pad layer 415 is electrically connected to external circuits or devices to transfer electrical signals between the joined array/peripheral device and the external circuits or devices. In some embodiments, BEOL interconnect layer 702 (e.g., contact layer 411) is electrically connected to source conductor layer 405/421 (e.g., in contact with the top surface of a conduction region of source conductor layer 405/421).

It is to be understood that in some embodiments, the order of forming the array device/array interconnect layer and of forming the peripheral device/peripheral interconnect layer can be modified, or the fabrication of the array device/array interconnect layer and the fabrication of the peripheral device/peripheral interconnect layer can be performed in parallel. Also, the order of forming the source conductor layer on the alternating conductor/dielectric stack and joining the array device and the peripheral device can be modified, according to some embodiments. In some embodiments, the source conductor layer is formed on the alternating conductor/dielectric stack prior to the joining of the array device and the peripheral device. In one example, after forming the NAND strings on the second substrate, the source conductor layer can be first formed to replace the second substrate, and then the array interconnect layer can be formed. In another example, after forming the NAND strings on the second substrate, the array interconnect layer can be formed first, and then the source conductor layer can be formed to replace the second substrate. In general, the timing of forming the source conductor layer is not limited and can occur in any suitable timing during the fabrication process of the 3D memory device (e.g., 3D memory device 100) disclosed herein.

Various embodiments in accordance with the present disclosure provide a 3D memory device with a source conductor layer in place of the silicon channel in the substrate used by other 3D memory devices. By replacing silicon with conductive materials (e.g., metal, metal alloy, and/or metal silicide) that form the source conductor layer disclosed herein, the resistance of the source side (e.g., between the common source contact and the NAND strings) of the 3D memory device can be reduced, thereby increasing the device operation speed. In some embodiments, the conduction mechanism for erase operation of the source select gate can become driven by gate-induced drain leakage (GIDL).

Moreover, compared with silicon substrate, the source conductor layer disclosed herein can be more easily patterned into any suitable layout (e.g., with different isolation regions) for driving a single memory block, multiple memory blocks, or a portion of a memory block as desired, which can enhance the driving capability of the peripheral device for the memory array. Due to its conductive nature, the source conductor layer disclosed herein can be patterned and used as an interconnect layer (e.g., part of the BEOL interconnect).

In some embodiments, a NAND memory device includes a substrate, an alternating conductor/dielectric stack, a NAND string, a source conductor layer, and a source contact. The alternating conductor/dielectric stack includes a plurality of conductor/dielectric pairs above the substrate. The NAND string extends vertically through the alternating conductor/dielectric stack. The source conductor layer is above the alternating conductor/dielectric stack and is in contact with a first end of the NAND string. The source contact includes a first end in contact with the source conductor layer. The NAND string is electrically connected to the source contact by the source conductor layer.

In some embodiments, a 3D memory device includes a substrate, a peripheral device on the substrate, a plurality of memory strings each extending vertically above the peripheral device, and a source conductor layer above the plurality of memory strings. An upper end of each of the plurality of memory strings is in contact with a first surface of the source conductor layer.

In some embodiments, a method for forming a NAND memory device is disclosed. An alternating conductor/dielectric stack is formed on a first substrate. A NAND string and a source contact both extending vertically through the alternating conductor/dielectric stack are formed. The first substrate is replaced with a source conductor layer, so that the source conductor layer is in contact with a first end of the NAND string and a first end of the source contact, and the NAND string is electrically connected to the source contact by the source conductor layer.

In some embodiments, a method for forming a 3D memory device is disclosed. An alternating conductor/dielectric stack is formed on a first substrate. A plurality of memory strings extending vertically through the alternating conductor/dielectric stack are formed, so that a first end of each of the plurality of memory strings is in contact with a first surface of the first substrate. The first substrate is removed. A source conductor layer is formed, so that the first end of each of the plurality of memory strings is in contact with a first surface of the source conductor layer.

In some embodiments, a method for forming a 3D memory device is disclosed. An alternating conductor/dielectric stack is formed on a first substrate. A plurality of memory strings extending vertically through the alternating conductor/dielectric stack are formed on a first side of the first substrate. The first substrate is thinned from a second side of the first substrate. A metal layer is formed on the second side of the thinned first substrate. A source conductor layer is formed based on a reaction between at least part of the metal layer and the thinned first substrate.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A NAND memory device, comprising:
   a substrate;
   an alternating conductor/dielectric stack comprising a plurality of conductor/dielectric pairs above the substrate;
   a NAND string extending vertically through the alternating conductor/dielectric stack;
   a source conductor layer above the alternating conductor/dielectric stack and in physical contact with a first end of the NAND string; and
   a source contact comprising a first end in physical contact with the source conductor layer, wherein the NAND string is electrically connected to the source contact by the source conductor layer.

2. The NAND memory device of claim 1, wherein the source conductor layer comprises one or more conduction regions each comprising one or more of a metal, a metal alloy, and a metal silicide.

3. The NAND memory device of claim 2, wherein the metal comprises one or more of copper, cobalt, nickel, titanium, and tungsten.

4. The NAND memory device of claim 2, wherein the metal alloy comprises an alloy of at least two of copper, cobalt, nickel, titanium, and tungsten.

5. The NAND memory device of claim 2, wherein the metal silicide comprises one or more of copper silicide, cobalt silicide, nickel silicide, titanium silicide, and tungsten silicide.

6. The NAND memory device of claim 1, further comprising an epitaxial silicon layer between the NAND string and the source conductor layer, wherein the NAND string is electrically connected to the source conductor layer by the epitaxial silicon layer.

7. The NAND memory device of claim 1, wherein:
   the source conductor layer comprises a plurality of conduction regions and one or more isolation regions electrically isolating the plurality of conduction regions; and
   the NAND string is electrically connected to the source contact by a first conduction region of the plurality of conduction regions.

8. The NAND memory device of claim 7, further comprising a through array contact (TAC) extending vertically through the alternating conductor/dielectric stack, wherein the TAC is in contact with a second conduction region of the plurality of conduction regions.

9. The NAND memory device of claim 8, further comprising a first interconnect layer comprising a first contact, wherein the NAND string is electrically connected to the first contact by the first conduction region.

10. The NAND memory device of claim 9, wherein the first interconnect layer further comprises a second contact and the TAC is electrically connected to the second contact by the second conduction region.

11. The NAND memory device of claim 10, further comprising a peripheral device between the substrate and the NAND string.

12. The NAND memory device of claim 11, further comprising a second interconnect layer above and in contact with the peripheral device, wherein the second interconnect layer comprises one or more conductor layers in one or more dielectric layers.

13. The NAND memory device of claim 12, further comprising a third interconnect layer in contact with a second end of the NAND string and a second end of the source contact, wherein the third interconnect layer comprises one or more conductor layers in one or more dielectric layers.

14. The NAND memory device of claim 13, further comprising a bonding interface between the second interconnect layer and the third interconnect layer, wherein the peripheral device is electrically connected to the NAND string by the second interconnect layer and the third interconnect layer.

15. A three-dimensional (3D) memory device, comprising:
   a substrate;
   a peripheral device on the substrate;
   a plurality of memory strings each extending vertically above the peripheral device;
   a source conductor layer above the plurality of memory strings, wherein an upper end of each of the plurality of memory strings is in physical contact with a first surface of the source conductor layer; and
   a first interconnect layer on a second surface of the source conductor layer, the second surface being opposite to the first surface.

16. The 3D memory device of claim 15, wherein the source conductor layer comprises a conduction region with an electrical conductivity of at least about $1 \times 10^4$ S/m at about 20° C.

17. The 3D memory device of claim 15, wherein the source conductor layer comprises a conduction region comprising one or more of a metal, a metal alloy, and a metal silicide.

18. The 3D memory device of claim 15, wherein each of the plurality of memory strings comprises an epitaxial plug at the upper end of the memory string.

19. The 3D memory device of claim 18, wherein each of the plurality of memory strings comprises a select gate configured to control a conductance of a corresponding epitaxial plug.

20. The 3D memory device of claim 19, wherein a conductance of the source conductor layer is independent from the select gate.

21. The 3D memory device of claim 15, further comprising:
   an alternating conductor/dielectric stack above the peripheral device, wherein each of the plurality of memory strings extends vertically through the alternating conductor/dielectric stack; and
   a second interconnect layer between the peripheral device and the alternating conductor/dielectric stack.

* * * * *